US012568781B2

(12) United States Patent
Musselwhite et al.

(10) Patent No.: US 12,568,781 B2
(45) Date of Patent: Mar. 3, 2026

(54) SELECTIVE SILICON TRIM BY THERMAL ETCHING

(71) Applicant: Lam Research Corporation, Fremont, CA (US)

(72) Inventors: Nathan Musselwhite, San Jose, CA (US); Ji Zhu, Castro Valley, CA (US); Gerome Michel Dominique Melaet, San Leandro, CA (US); Mark Naoshi Kawaguchi, San Carlos, CA (US)

(73) Assignee: Lam Research Corporation, Fremont, CA (US)

( * ) Notice: Subject to any disclaimer, the term of this patent is extended or adjusted under 35 U.S.C. 154(b) by 383 days.

(21) Appl. No.: 18/004,051

(22) PCT Filed: Jan. 21, 2022

(86) PCT No.: PCT/US2022/013407
§ 371 (c)(1),
(2) Date: Dec. 30, 2022

(87) PCT Pub. No.: WO2022/159765
PCT Pub. Date: Jul. 28, 2022

(65) Prior Publication Data
US 2023/0268189 A1 Aug. 24, 2023

Related U.S. Application Data

(60) Provisional application No. 63/199,789, filed on Jan. 25, 2021.

(51) Int. Cl.
*H01L 21/311* (2006.01)
*H01L 21/321* (2006.01)
*H01L 21/67* (2006.01)

(52) U.S. Cl.
CPC .. *H01L 21/31116* (2013.01); *H01L 21/32105* (2013.01); *H01L 21/67069* (2013.01)

(58) Field of Classification Search
None
See application file for complete search history.

(56) References Cited

U.S. PATENT DOCUMENTS

| | | |
|---|---|---|
| 5,709,757 A | 1/1998 | Hatano et al. |
| 5,783,495 A | 7/1998 | Li et al. |

(Continued)

FOREIGN PATENT DOCUMENTS

| | | |
|---|---|---|
| CN | 101490810 B | 4/2011 |
| CN | 103081072 A | 5/2013 |

(Continued)

OTHER PUBLICATIONS

CN Office Action dated Apr. 3, 2025 in CN Application No. 201980065936.3, with English Translation.

(Continued)

*Primary Examiner* — Roberts P Culbert
(74) *Attorney, Agent, or Firm* — Weaver Austin Villeneuve & Sampson LLP

(57) ABSTRACT

Methods and apparatuses for precise trimming of silicon-containing materials are provided. Methods involve oxidizing silicon-containing materials and thermally removing the oxidized silicon-containing materials at particular temperatures for a self-limiting etch process. Methods also involve a surface reaction limited process using a halogen source and modulated temperature and exposure duration to etch small amounts of silicon-containing materials. Apparatuses are capable of flowing multiple oxidizers at particular temperature ranges to precisely etch substrates.

14 Claims, 10 Drawing Sheets

(56)         References Cited

U.S. PATENT DOCUMENTS

| | | | |
|---|---|---|---|
| 6,299,724 | B1 | 10/2001 | Fayfield et al. |
| 6,485,531 | B1 | 11/2002 | Schöb |
| 7,192,910 | B2 | 3/2007 | Wojtczak et al. |
| 7,416,989 | B1 * | 8/2008 | Liu ............... H01L 21/02063 |
| | | | 438/706 |
| 7,977,249 | B1 * | 7/2011 | Liu ............... H01L 21/76825 |
| | | | 438/724 |
| 8,926,788 | B2 | 1/2015 | Hohenwarter |
| 9,234,133 | B2 | 1/2016 | Takada et al. |
| 9,484,229 | B2 | 11/2016 | Lach et al. |
| 9,508,547 | B1 | 11/2016 | Pasquale et al. |
| 11,488,831 | B2 | 11/2022 | Zhu et al. |
| 11,823,892 | B2 | 11/2023 | Zhu et al. |
| 2002/0096190 | A1 | 7/2002 | Roy et al. |
| 2003/0236642 | A1 | 12/2003 | Timans |
| 2004/0020513 | A1 | 2/2004 | Bergman |
| 2004/0026400 | A1 | 2/2004 | Ptak |
| 2005/0230350 | A1 * | 10/2005 | Kao ............... H01L 21/31116 |
| | | | 438/715 |
| 2006/0046513 | A1 | 3/2006 | Shea et al. |
| 2006/0084192 | A1 | 4/2006 | Zhang |
| 2006/0105516 | A1 * | 5/2006 | Belyansky ........... H10D 86/201 |
| | | | 257/E21.633 |
| 2006/0196527 | A1 | 9/2006 | Nishimura et al. |
| 2008/0110748 | A1 | 5/2008 | Starzynski |
| 2009/0142513 | A1 | 6/2009 | Murakami et al. |
| 2009/0192065 | A1 | 7/2009 | Korzenski et al. |
| 2009/0275205 | A1 | 11/2009 | Kiehlbauch et al. |
| 2010/0314377 | A1 | 12/2010 | Kasai et al. |
| 2011/0155181 | A1 | 6/2011 | Inatomi |
| 2011/0183522 | A1 | 7/2011 | Mikhaylichenko et al. |
| 2011/0207302 | A1 | 8/2011 | Wang et al. |
| 2011/0266252 | A1 | 11/2011 | Thadani et al. |
| 2012/0083127 | A1 | 4/2012 | Clark et al. |
| 2012/0118225 | A1 | 5/2012 | Hsu et al. |
| 2012/0131815 | A1 | 5/2012 | Kraus et al. |
| 2012/0181249 | A1 | 7/2012 | Ohto et al. |
| 2013/0014785 | A1 | 1/2013 | Kimura et al. |
| 2013/0137267 | A1 | 5/2013 | Chang et al. |
| 2013/0280123 | A1 | 10/2013 | Chen et al. |
| 2014/0026926 | A1 | 1/2014 | Semmelrock et al. |
| 2014/0263177 | A1 | 9/2014 | Povolny et al. |
| 2014/0376897 | A1 | 12/2014 | Ranish et al. |
| 2015/0093100 | A1 | 4/2015 | Ranish |
| 2015/0096683 | A1 | 4/2015 | Deshmukh et al. |
| 2015/0170977 | A1 | 6/2015 | Singh |
| 2015/0270148 | A1 | 9/2015 | Shinoda et al. |
| 2015/0357187 | A1 | 12/2015 | Morimoto et al. |
| 2015/0371869 | A1 | 12/2015 | Surla et al. |
| 2015/0380268 | A1 | 12/2015 | Toda et al. |
| 2016/0056054 | A1 | 2/2016 | Takahashi et al. |
| 2016/0254162 | A1 | 9/2016 | Okutani et al. |
| 2016/0307786 | A1 | 10/2016 | Evans et al. |
| 2016/0351390 | A1 | 12/2016 | Morimoto et al. |
| 2017/0186620 | A1 | 6/2017 | Marumoto et al. |
| 2017/0316963 | A1 | 11/2017 | Parkhe |
| 2017/0328775 | A1 | 11/2017 | Aderhold |
| 2018/0047593 | A1 | 2/2018 | Mui et al. |
| 2018/0076018 | A1 | 3/2018 | Otsuji |
| 2018/0182597 | A1 | 6/2018 | Blomberg et al. |
| 2018/0261481 | A1 | 9/2018 | Eto |
| 2018/0323092 | A1 | 11/2018 | Rao et al. |
| 2019/0051541 | A1 | 2/2019 | Hill et al. |
| 2019/0055654 | A1 | 2/2019 | George et al. |
| 2019/0086808 | A1 | 3/2019 | Nakayama et al. |
| 2019/0157168 | A1 | 5/2019 | Kawarazaki |
| 2019/0264035 | A1 | 8/2019 | Aoki et al. |
| 2019/0311923 | A1 | 10/2019 | Kim |
| 2019/0318946 | A1 | 10/2019 | Kim |
| 2020/0035489 | A1 | 1/2020 | Huang et al. |
| 2020/0066540 | A1 | 2/2020 | Hudson et al. |
| 2020/0098575 | A1 | 3/2020 | Takahashi et al. |
| 2020/0294797 | A1 | 9/2020 | Nozawa et al. |
| 2020/0365411 | A1 | 11/2020 | Suzuki et al. |
| 2021/0022212 | A1 | 1/2021 | Cimino et al. |

| | | | |
|---|---|---|---|
| 2021/0082710 | A1 | 3/2021 | Takahashi et al. |
| 2021/0104414 | A1 | 4/2021 | Panagopoulos et al. |
| 2021/0249274 | A1 | 8/2021 | Zhu et al. |
| 2021/0280410 | A1 | 9/2021 | Otsuji |
| 2021/0328013 | A1 | 10/2021 | Ando et al. |
| 2021/0366738 | A1 | 11/2021 | Bandarapu et al. |
| 2021/0375634 | A1 | 12/2021 | Suzuki et al. |
| 2021/0391166 | A1 | 12/2021 | Zhu et al. |
| 2022/0254645 | A1 | 8/2022 | Luan et al. |
| 2022/0356585 | A1 | 11/2022 | Mui et al. |
| 2023/0131233 | A1 | 4/2023 | Lavdovsky et al. |
| 2023/0207328 | A1 | 6/2023 | Musselwhite |
| 2024/0038526 | A1 | 2/2024 | Zhu et al. |
| 2024/0355650 | A1 | 10/2024 | Kanakasabapathy et al. |
| 2025/0125165 | A1 | 4/2025 | Kanakasabapathy et al. |
| 2025/0183051 | A1 | 6/2025 | Gordon et al. |
| 2025/0216268 | A1 | 7/2025 | Kalinovski et al. |
| 2025/0218819 | A1 | 7/2025 | Kalinovski et al. |

FOREIGN PATENT DOCUMENTS

| | | |
|---|---|---|
| CN | 105719949 A | 6/2016 |
| CN | 105990113 A | 10/2016 |
| CN | 106920743 A | 7/2017 |
| CN | 107818912 A | 3/2018 |
| JP | H02256235 A | 10/1990 |
| JP | H05326480 A | 12/1993 |
| JP | H08195381 A | 7/1996 |
| JP | H09509531 A | 9/1997 |
| JP | 2001503571 A | 3/2001 |
| JP | 2002521817 A | 7/2002 |
| JP | 2007227764 A | 9/2007 |
| JP | 2007531309 A | 11/2007 |
| JP | 2009042248 A | 2/2009 |
| JP | 2009253242 A | 10/2009 |
| JP | 2010034491 A | 2/2010 |
| JP | 2013522882 A | 6/2013 |
| JP | 2014197603 A | 10/2014 |
| JP | 2014225629 A | 12/2014 |
| JP | 2015056624 A | 3/2015 |
| JP | 2015231043 A | 12/2015 |
| JP | 2016012609 A | 1/2016 |
| JP | 2016076529 A | 5/2016 |
| JP | 2016096341 A | 5/2016 |
| JP | 2016170964 A | 9/2016 |
| JP | 2017224807 A | 12/2017 |
| JP | 2018046260 A | 3/2018 |
| JP | 2019114628 A | 7/2019 |
| JP | 2019114653 A | 7/2019 |
| JP | 2019521522 A | 7/2019 |
| JP | 2019212872 A | 12/2019 |
| JP | 2020522130 A | 7/2020 |
| JP | 2020188135 A | 11/2020 |
| JP | 2021150488 A | 9/2021 |
| KR | 20050014877 A | 2/2005 |
| KR | 100575847 B1 | 5/2006 |
| KR | 20070034824 A | 3/2007 |
| KR | 20110077705 A | 7/2011 |
| KR | 20110123078 A | 11/2011 |
| KR | 20120040124 A | 4/2012 |
| KR | 20130035039 A | 4/2013 |
| KR | 20140064227 A | 5/2014 |
| KR | 20140132601 A | 11/2014 |
| KR | 20160078405 A | 7/2016 |
| KR | 20170049962 A | 5/2017 |
| KR | 20170077042 A | 7/2017 |
| KR | 20180014436 A | 2/2018 |
| KR | 20180029914 A | 3/2018 |
| KR | 102078157 B1 | 2/2020 |
| TW | 201333171 A | 8/2013 |
| TW | 201601217 A | 1/2016 |
| TW | 201739951 A | 11/2017 |
| TW | 201814395 A | 4/2018 |
| TW | 201942997 A | 11/2019 |
| WO | WO-03080892 A1 | 10/2003 |
| WO | WO-2004001840 A1 | 12/2003 |
| WO | WO-2012165861 A2 | 12/2012 |
| WO | WO-2019083735 A1 | 5/2019 |
| WO | WO-2019108366 A1 | 6/2019 |

(56) References Cited

FOREIGN PATENT DOCUMENTS

| WO | WO2018074535 A1 | 9/2019 |
| WO | WO-2019169009 A1 | 9/2019 |
| WO | WO-2019226341 A1 | 11/2019 |
| WO | WO-2020041441 A1 | 2/2020 |
| WO | WO-2020054476 A1 | 3/2020 |
| WO | WO-2020264158 A1 | 12/2020 |
| WO | WO-2021202171 A1 | 10/2021 |
| WO | WO-2021202411 A1 | 10/2021 |

OTHER PUBLICATIONS

CN Office Action dated Jan. 26, 2025 in CN Application No. 201980065936.3, with English Translation.

CN Office Action dated Jun. 21, 2024 in CN Application No. 201980065936.3 with English Translation.

International Preliminary Report on Patentability and Written Opinion dated Dec. 28, 2023 in PCT Application No. PCT/US2022/033488.

International Preliminary Report on Patentability and Written Opinion dated Feb. 27, 2025 in PCT Application No. PCT/US2023/029465.

International Preliminary Report on Patentability and Written Opinion dated Feb. 29, 2024 in PCT Application No. PCT/US2022/075035.

International Preliminary Report on Patentability and Written Opinion dated Oct. 10, 2024 in PCT Application No. PCT/US2023/016762.

International Preliminary Report on Patentability and Written Opinion dated Oct. 24, 2024 in PCT Application No. PCT/US2023/064577.

International Preliminary Report on Patentability and Written Opinion dated Sep. 12, 2024 in PCT Application No. PCT/US2023/062787.

International Search Report and Written Opinion dated Nov. 24, 20223 in PCT Application No. PCT/US2023/029465.

JP Office Action dated Dec. 24, 2024 in JP Application No. 2022-559851, with English Translation.

JP Office Action dated Mar. 11, 2025 in JP Application No. 2022-559850, with English Translation.

JP Office Action dated Nov. 26, 2024 in JP Application No. 2022-559850, with English Translation.

KR Decision to Grant and Search Report dated Apr. 3, 2025 in KR Application No. 10-2021-7013387, with English translation.

KR Office Action dated Aug. 26, 2024 in KR Application No. 10-2021-7013387, with English Translation.

KR Office Action dated Dec. 11, 2024 in KR Application No. 10-2022-7038172, with English Translation.

PubChem CID 14917 (2025) "Compound Summary—Hydrofluoric Acid", Created Date: Sep. 16, 2004, 141 Pages; Downloaded from URL: https://pubchem.ncbi.nlm.nih.gov/compound/14917.

PubChem CID 702 (2025) "Compound Summary—Ethanol", Created Date: Sep. 16, 2004, 220 Pages; Downloaded from URL: https://pubchem.ncbi.nlm.nih.gov/compound/702.

TW Office Action dated Jul. 31, 2024 in TW Application No. 110111486, with English Translation.

TW Office Action dated Mar. 1, 2024 in TW Application No. 108135456 with English Translation.

TW Office Action dated Sep. 23, 2024 in TW Application No. 110111832, with English Translation.

U.S. Final Office Action dated Nov. 21, 2024 in U.S. Appl. No. 18/485,249.

U.S. Non-Final Office Action dated Jul. 1, 2024 in U.S. Appl. No. 18/485,249.

U.S. Non-Final Office Action dated Mar. 4, 2025 in U.S. Appl. No. 17/995,290.

U.S. Appl. No. 18/684,643, inventor Kanakasabapathy S, filed on Feb. 16, 2024.

U.S. Appl. No. 18/848,895, inventors Kalinovski I, et al., filed on Sep. 19, 2024.

U.S. Appl. No. 19/103,350, inventors Melaet G.M et al., filed on Feb. 12, 2025.

U.S. Restriction Requirement dated Apr. 25, 2024 in U.S. Appl. No. 18/485,249.

U.S. Restriction Requirement dated Nov. 25, 2024 in U.S. Appl. No. 17/995,290.

International Preliminary Report on Patentability dated Oct. 13, 2022, in PCT Application No. PCT/US2021/023701.

International Search Report and Written Opinion dated Jul. 15, 2021, in PCT Application No. PCT/US2021/023701.

International Preliminary Report on Patentability dated Apr. 15, 2021, in Application No. PCT/US2019/053249.

International Preliminary Report on Patentability dated Aug. 3, 2023, in Application No. PCT/US2022/013407.

International Preliminary Report on Patentability dated Oct. 13, 2022, in PCT Application No. PCT/US2021/024708.

International Search Report and Written Opinion dated Dec. 5, 2022 in PCT Application No. PCT/US2022/075035.

International Search Report and Written Opinion dated Jan. 13, 2020, in Application No. PCT/US2019/053249.

International Search Report and Written Opinion dated Jul. 12, 2023, in Application No. PCT/US2023/064577.

International Search Report and Written Opinion dated Jul. 15, 2021, in Application No. PCT/US2021/024708.

International Search Report and Written Opinion dated Jul. 24, 2023 in PCT Application No. PCT/US2023/016766.

International Search Report and Written Opinion dated Jul. 31, 2023, in Application No. PCT/US2023/016762.

International Search Report and Written Opinion dated Jun. 16, 2023, in Application No. PCT/US2023/062787.

International Search Report and Written Opinion dated May 9, 2022, in PCT Application No. PCT/US2022/013407.

International Search Report and Written Opinion dated Oct. 17, 2022 in PCT Application No. PCT/US2022/033488.

International Search Report dated Dec. 10, 2019, in Application No. PCT/US2019/047458.

International Search Report dated Jan. 30, 2019, in Application No. PCT/US2018/055436.

Kazunori, S. et al., "Isotropic Atomic Level Etching of Tungsten Using Formation and Desorption of Tungsten Fluoride," Proceedings of SPIE, Mar. 2018, vol. 10589, 7 pages.

Mini O2 Oxygen Sensor 0-30% vol. 02, Euro-Gas Management Services LTD, Jan. 2017.

"Optical Properties of Silicon"[exact date of publication unknown; summarizing data from papers published in 1995 and 2008], https://www.pveducation.org/pvcdrom/materials/optical-properties-of-silicon.

Pattison, P.M., et al., "LED lighting Efficacy: Status and Directions," Comptes Rendus Physique, vol. 19, Apr. 2018, pp. 134-145.

TW Office Action dated Aug. 16, 2023, in application No. TW108135456 with English Translation.

U.S Advisory Action dated Jun. 20, 2023 in U.S. Appl. No. 17/281,691.

U.S. Final office Action dated Mar. 15, 2023 in U.S. Appl. No. 17/281,691.

U.S. Non-Final Office Action dated Oct. 20, 2022, in U.S. Appl. No. 17/281,691.

U.S. Notice of Allowance dated Jul. 12, 2023 in U.S. Appl. No. 17/281,691.

U.S. Notice of Allowance dated Sep. 25, 2023 in U.S. Appl. No. 17/281,691.

U.S. Appl. No. 17/995,032, inventors Nathan et al., filed on Sep. 29, 2022.

U.S. Appl. No. 18/485,249, inventors Zhu J, et al., filed on Oct. 11, 2023.

JP Decision to Grant and Search Report dated Jun. 24, 2025 in JP Application No. 2022-559850, with English translation.

JP Office Action dated Aug. 26, 2025 in JP Application No. 2023-519875, with English Translation.

JP Office Action dated Sep. 9, 2025 in JP Application No. 2022-559851, with English Translation.

KR Decision for Grant and Search Report dated Aug. 7, 2025 in KR Application No. 10-2022-7038172, with English translation.

(56)         References Cited

OTHER PUBLICATIONS

KR Office Action dated Jul. 14, 2025 in KR Application No. 10-2022-7038346, with English Translation.

TW Office Action and Search Report dated Jun. 20, 2025 in TW Application No. 111102804, with English Translation.

TW Office Action and Search Report dated Sep. 15, 2025 in TW Application No. 114110878, with English Translation.

TW Office Action dated May 6, 2025 in TW Application No. 110111832, with English Translation.

U.S. Final Office Action dated Sep. 5, 2025 in U.S. Appl. No. 17/995,290.

US Non-Final Office Action dated Jul. 14, 2025 in U.S. Appl. No. 18/485,249.

U.S. Non-Final Office Action dated Sep. 24, 2025 in U.S. Appl. No. 17/995,032.

* cited by examiner

SELECTIVE SILICON TRIM BY THERMAL ETCHING

INCORPORATION BY REFERENCE

A PCT Request Form is filed concurrently with this specification as part of the present application. Each application that the present application claims benefit of or priority to as identified in the concurrently filed PCT Request Form is incorporated by reference herein in their entireties and for all purposes.

BACKGROUND

Semiconductor fabrication often involves patterning schemes and other processes whereby silicon-containing materials are etched relative to other materials on exposed surfaces of a substrate. As device geometries become smaller and smaller, high etch selectivity processes are desired to achieve effective selective etching.

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

One aspect involves a method for etching a substrate, the method including: providing the substrate in a reaction chamber, the substrate including a silicon-containing material that is to be partially or wholly removed from the substrate during etching; providing an oxidant in the reaction chamber and exposing the substrate to the oxidant to modify the silicon-containing material on the substrate to form a modified silicon-containing material; and providing a removal gas in the reaction chamber and exposing the substrate to the removal gas while providing thermal energy to the reaction chamber to drive a reaction that partially or wholly etches the silicon-containing material from the substrate by removing the modified silicon-containing material, whereby the substrate is not exposed to plasma during etching.

In various embodiments, the oxidant is one or more of oxygen, hydrogen peroxide, nitrous oxide, nitric oxide, ozone, and combinations thereof.

In various embodiments, the providing the oxidant and providing the removal gas are performed in cycles.

In some embodiments, each cycle etches about 0.3 Å to about 0.5 Å of silicon-containing material. In some embodiments, the oxidant includes oxygen.

In some embodiments, each cycle etches about 1.5 Å to about 3.5 Å of silicon-containing material. In some embodiments, the oxidant includes ozone.

In various embodiments, the thermal energy is provided at a temperature of about 350° C. to about 400° C. and the oxidant includes oxygen.

In various embodiments, the thermal energy is provided at a temperature of about 50° C. to about 150° C. and the oxidant includes ozone.

In various embodiments, the method also includes prior to providing the oxidant, providing a gas mixture in the reaction chamber and exposing the substrate to thermal energy and to the gas mixture, such that the thermal energy drives a second reaction between the gas mixture and the silicon-containing material to form a modified silicon-containing material, and the second reaction etches the modified silicon-containing material to thereby partially or wholly etch the silicon-containing material.

In various embodiments, the removal gas includes an organic solvent and/or water. For example, the organic solvent and/or water may be any one or more of alcohols, alkanes, aromatic solvents, ethers, nitriles, and heterocycles.

In various embodiments, the removal gas also includes an additive. For example, the additive may be any one or more of amines, amino acids, oxidizers, bifluoride sources, aldehydes, carbenes, and organic acids.

In various embodiments, the removal gas includes a halogen source such as any one or more of hydrogen fluoride (HF), hydrogen chloride (HCl), hydrogen bromide (HBr), fluorine ($F_2$), chlorine ($Cl_2$), bromine ($Br_2$), chlorine trifluoride ($ClF_3$), nitrogen trifluoride ($NF_3$), nitrogen trichloride ($NCl_3$), and nitrogen tribromide ($NBr_3$).

In various embodiments, the additive is from about 0.1 to about 5% (by weight) of the total amount of the additive and the organic solvent and/or water.

In various embodiments, the volumetric ratio of the halogen source to the additive is no more than 10.

In various embodiments, the etching is self-limiting.

Another aspect involves a method for etching a substrate, the method including: providing the substrate in a reaction chamber, the substrate including a silicon-containing material that is to be partially or wholly removed from the substrate during etching; and providing fluorine gas in the reaction chamber and exposing the substrate to the fluorine gas to etch a silicon-containing material on the substrate at a temperature about 50° C. to about 80° C. to etch about 0.1 nm to about 10 nm of silicon-containing material during the exposing, whereby the substrate is not exposed to plasma during etching.

In various embodiments, providing the removal gas includes selectively etching the silicon-containing material with respect to the substrate.

In some embodiments, the silicon-containing material is poly-silicon.

In some embodiments, the silicon-containing material is boron-doped silicon.

In some embodiments, the silicon-containing material is epitaxial silicon.

Another aspect involves an apparatus for etching a substrate, the apparatus including: a reaction chamber; a substrate support configured to support the substrate during etching; an inlet for introducing a gas mixture to the reaction chamber, wherein the gas mixture is vapor phase; an outlet for removing vapor phase species from the reaction chamber; and a controller configured to cause any of the methods described herein.

These and other aspects are described further below with reference to the drawings.

DETAILED DESCRIPTION

Figure 1A:
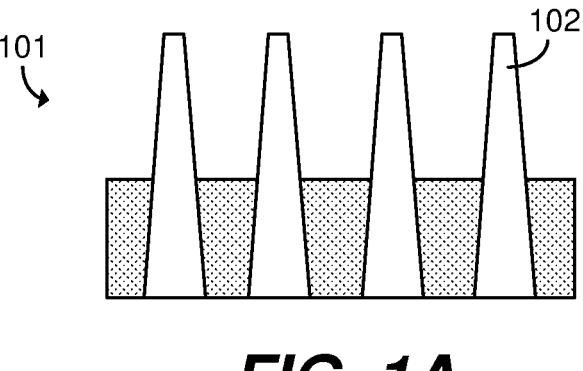
FIGS. 1A-1C depict a semiconductor substrate as it undergoes processing according to certain disclosed embodiments.

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Semiconductor fabrication processes often involve patterning and etching of various materials, such as silicon-containing materials. During some fabrication processes, the amount to be etched is controlled carefully to ensure small and accurate amounts of etching of the silicon-containing materials are achieved. Such processes may also involve precise etching with no loading effects as measured from top to bottom (e.g., comparing amount etched within a feature comparing relative etching at or near the top of the feature or an opening of the feature compared to the bottom of the feature), from feature to feature (e.g., comparing amount etched across multiple features to ensure features are etched uniformly across a wafer), or from center to edge (e.g., comparing amount etched in the center of a wafer as compared to edge of a wafer). On example of an application of etching silicon-containing material is a silicon recess operation for uniform isotropic etching up to about 1 nm of silicon-containing material. It may be desirable to achieve this etching with minimal absolute film loss.

In general, methods of silicon trimming involve wet clean or dry plasma radical etching. However, wet clean etching can be more expensive or cause selectivity issues, and resulting features may collapse while drying. While dry plasma radical etching may be used to etch silicon-containing materials effectively, radical etch solutions may be too aggressive due to the higher etch rate, and may not necessarily be able to be controlled finely to etch less than about 10 nm with 0.1 nm precision. Absolute film loss is also a concern when plasma is used. Some conventional dry etch processes involve introducing highly polymerizing, carbon-based gases during etch to form a thin protection layer on the surface of an exposed silicon oxide or silicon layer, but such processes may cause defects and increase the top-to-bottom ratio of a pattern and increase the pattern loading. Defects may also lead to pattern collapse to the extent that the device may be rendered useless. Radical etching may also not necessarily achieve top-to-bottom uniformity throughout a feature, so a feature may be etched more at the top near the feature opening than at the bottom of the feature. As devices shrink, etching processes to achieve very small amounts of etching become challenging.

Provided herein are methods of selectively trimming silicon-containing material by thermal etching. Methods involve performing oxidation and etch cycling to selectively and precisely trim silicon-containing materials. Etching can be selective to nitride, carbonitride, and oxycarbide materials. One advantage of certain disclosed techniques is that they achieve extremely precise control of the etching rate. Such etch rate control is substantially improved compared to other thermal (e.g., non-plasma) etching techniques. Another advantage of the disclosed techniques is that they achieve a very high degree of etch selectivity. For instance, an oxide material may be etched with a high degree of selectivity compared to a nitride material. Other materials may be similarly etched in a selective manner.

The techniques described herein may be used to etch a variety of substrate materials in a number of different contexts. In many cases, the substrate includes two or more different materials that are exposed on a surface of the substrate. One of these materials may be targeted for removal over another of these materials in a selective etching process. In some implementations, the substrate includes a first material and a second material, the first material being selectively etched compared to the second material. In other cases, the substrate may include only a single material that is exposed, such that the etching does not need to be selective. In still other cases, the substrate may include multiple different materials that are all removed without any need for selectivity. The first and/or second materials on the substrate may each be selected from the group consisting of: oxides (e.g., silicon oxide, tin oxide, etc.), nitrides (e.g., silicon nitride, tantalum nitride, titanium nitride, etc.), carbides (e.g., silicon carbide, etc.), carbonitrides (e.g., silicon carbonitride, etc.), carboxides (e.g., silicon carboxide, etc.), etc.

In some embodiments, etching is performed in the presence of an exposed hardened oxide such that etching of silicon-containing materials is carefully controlled so as not to etch the hardened oxide. Hardened oxide may be defined as oxide material that has undergone a high temperature anneal process. Certain embodiments involve oxidizing silicon-containing material in the presence of hardened oxide material to allow selective etching of the oxidized silicon-containing material relative to the hardened oxide material. The oxidized silicon-containing material formed from certain disclosed embodiments is weaker than the hardened oxide material, thereby allowing the oxidized silicon-containing material to be more easily removed relative to the hardened oxide material to achieve selectivity.

Methods can be performed in an etch chamber capable of using multiple oxidizers, running at multiple process temperatures, and performing multiple cycles of oxidation and etching. Methods involve performing self-limiting processes whereby silicon-containing materials are first oxidized to form $Si_xO_y$ and the formed $Si_xO_y$ is then etched using oxide etching vapors. Certain disclosed embodiments are thermal processes and are plasma-free or plasmaless. Etching processes described herein are capable of precisely etching about 0.5 nm to about 10 nm of silicon-containing material using monolayer etching with about 0.02 to about 0.3 nm precision. Etching processes are also capable of high selectivity etching relative to oxides and spacer materials. Certain disclosed embodiments involve performing thermal and surface reaction limited etching of silicon.

Figure 1B:
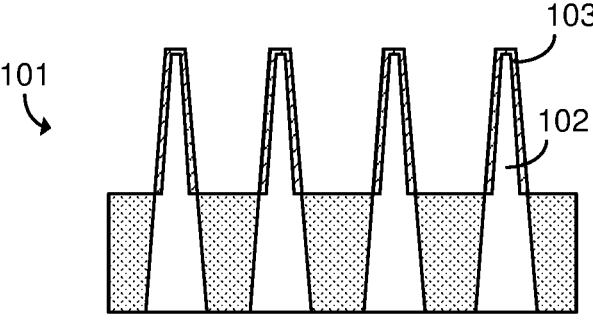
Figure 1C:
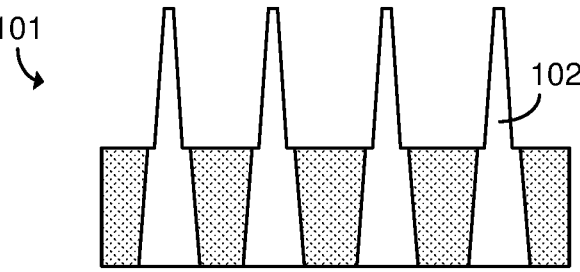

Etching of small amounts of silicon-containing material is applicable to many different applications in semiconductor fabrication. For example, a silicon-containing fin material could be trimmed with selectivity to a variety of materials including but not limited to silicon oxide, silicon nitride (SiN), and other oxides. In one particular embodiment, the methods described herein may be used in the context of trimming silicon fins. FIGS. 1A-1C, described further below, illustrate such an embodiment. In another particular embodiment, the methods described herein may be used in the context of removing native oxide on gate-all-around structures.

In the particular example shown in FIG. 1A, the substrate 101 includes silicon fins 102 as well as an exposed spacer layer (not shown) that includes a spacer material such as SiN, silicon carbonitride (SiCN), or silicon oxycarbide (SiCO). In this example, it is desired to trim the fins such that they become smaller. Silicon-containing fin material may include amorphous silicon, epitaxial silicon, or doped silicon, such as boron-doped silicon.

In the context of the embodiment shown in FIGS. 1A-1C, the first reactant or first gas mixture includes an oxidizing species (e.g., oxygen ($O_2$) or other oxidizing species) that will act to modify the silicon fins 302 to form silicon oxide 103, as described below. In many embodiments, the first reactant or first gas mixture may selectively modify one or more of the materials on the substrate 101 compared to other materials on the substrate 101. For instance, in the context of FIGS. 1A-1C, oxygen provided to the reaction chamber will selectively modify the silicon fins 102, with substantially less modification (or no modification) occurring on other materials such as the spacer material.

In the embodiment of FIGS. 1A-1C, exposure to the first reactant or first gas mixture results in modifying the exposed surface of the silicon fins 102 to form a thin layer of silicon oxide 103, as shown in FIG. 1B. Many other applications are possible.

In another example, small amounts of a poly-silicon structure may be removed isotropically in some fabrication processes. Damaged silicon-rich films may be a silicon film that was previously damaged by a hole or channel etch. In some embodiments, damaged silicon-rich films may include be silicon with oxygen impurities ($SiO_x$) or silicon with polymer ($C_xF$) residues. Removal of damaged silicon-rich films may be performed during semiconductor processing but the amount of damaged silicon-rich films may be very thin, and etching of such materials may be challenging with plasma-based processes.

Figure 2:
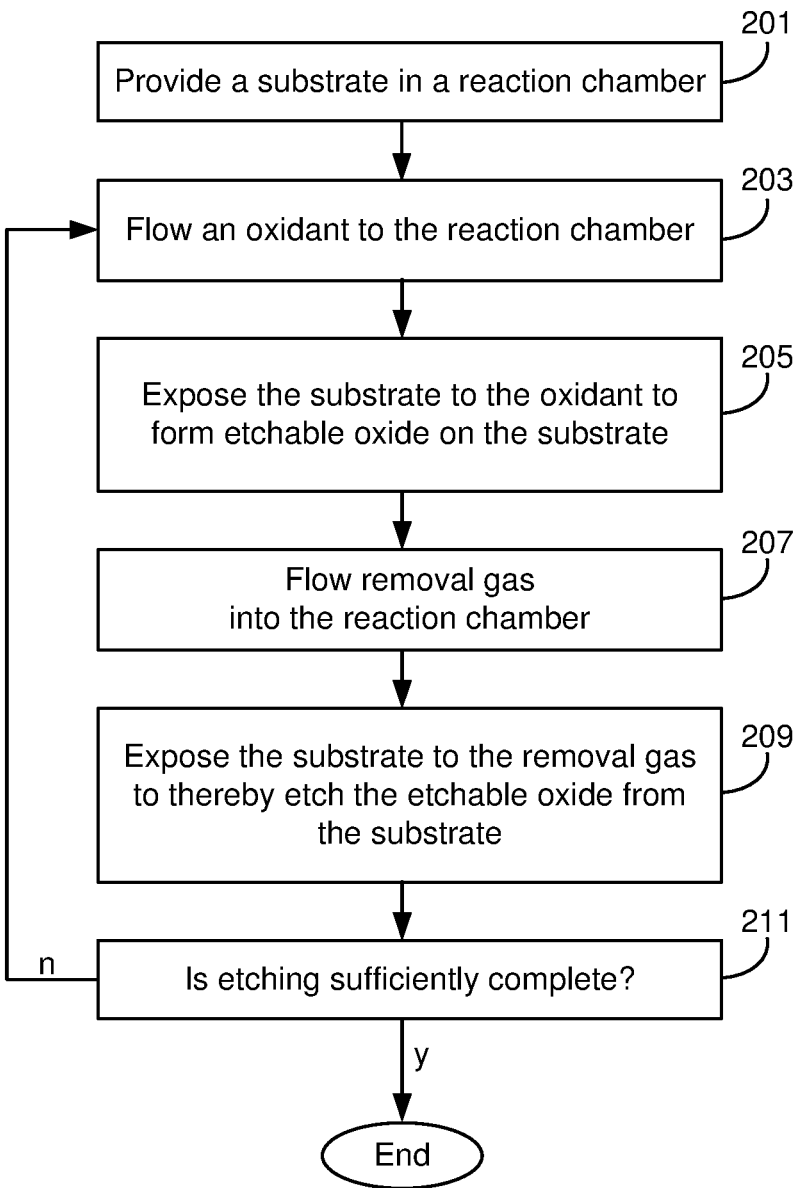
FIG. 2 is a process flow diagram depicting operations performed in accordance with certain disclosed embodiments.

FIG. 2 includes a process flow diagram depicting operations performed in accordance to certain disclosed embodiments. In operation 201, a substrate is provided to a reaction chamber. The substrate may be a silicon or other semiconductor wafer, e.g., a 200-mm wafer, a 300-mm wafer, or a 450-mm wafer, including wafers having one or more layers of material, such as dielectric, conducting, or semi-conducting material deposited thereon. The methods may also be applied to form metallization stack structures on other substrates, such as glass, plastic, and the like. In some embodiments, the substrate includes silicon. In various embodiments, silicon is poly-silicon.

The substrate may have one or more materials thereon, as described above. One or more of these materials may be targeted for removal compared to other materials present on the substrate. For example, a substrate may include silicon fins 302 as well as an exposed spacer layer that includes a spacer material such as SiN, SiCN, or SiCO. In this example, it is desired to trim the fins such that they become smaller.

In operation 203, an oxidant is flowed to the reaction chamber. Oxidants are flowed as gases or vapors without igniting a plasma. Example oxidants include $O_2$, ozone ($O_3$), hydrogen peroxide ($H_2O_2$) vapor, nitrous oxide ($N_2O$), nitric oxide (NO), and combinations thereof. Some oxidants may be introduced with photon dissociation oxidizers, such as oxygen.

The oxidant selected depends on the material to be trimmed or etched on the substrate. For example, if the material is a doped silicon material, a stronger oxidant may be selected, such as $O_3$, whereas if the material to be etched is a poly-silicon, a weaker oxidant such as $O_2$ may be used instead. In one example, a boron-doped silicon may be etched using $O_3$.

Oxidant selection may also depend on the presence of other materials on the substrate for which etching of the silicon-containing material is selective to so as to achieve selectivity when etching. For example, an oxidant may be selected such that when it oxidizes the silicon-containing material to be etched on the substrate, it does not form a silicon oxide similar in chemical properties to other exposed silicon oxide on the substrate so as not to risk removing the other exposed silicon oxide in subsequent operations. In some embodiments, using oxygen as an oxidant to etch silicon material can achieve an etch selectivity to annealed oxide of at least about 5:1.

The oxidant may be used to modify one or more materials present on the surface of the substrate. In some cases, the modification involves formation of an oxide material. In these or other cases, the modification involves fluorination of an exposed material, organic molecule adsorption on an exposed material, etc. Various surface modifications are available. In some embodiments, the oxidant includes an oxidizing species (e.g., $O_2$ or other oxidizing species) that will act to modify silicon fins to form silicon oxide, as described below. In many embodiments, the first reactant or first gas mixture may selectively modify one or more of the materials on the substrate 101 compared to other materials on the substrate. For instance, oxygen could be provided to the reaction chamber to selectively modify the silicon fins, with substantially less modification (or no modification) occurring on other materials such as the spacer material.

In operation 205, the substrate is exposed to the oxidant to from an etchable oxide on the substrate. In various embodiments, exposure to the oxidant results in modifying the exposed surface of the silicon fins to form a thin layer of silicon oxide. In various embodiments, the substrate is exposed to the oxidant without igniting a plasma.

In some implementations, one or more processing variable may be controlled during etching. For instance, a pressure within the reaction chamber may be controlled at about 10 Torr or less, for example about 0.2 Torr to about 10 Torr in some embodiments, or about 5 Torr. A temperature within the reaction chamber may be controlled, for example by controlling the temperature of a substrate support on which the substrate is positioned during etching, and/or by controlling the temperature of the gas mixture and/or the temperature of showerhead used to deliver the gas mixture into the reaction chamber. In some embodiments, the temperature of one or more of the reaction chamber, the substrate support, and the showerhead may be controlled during etching, for example at temperatures about 20° C. to about 500° C. In some embodiments, the temperature of one or more of these elements may cycle between two or more different temperatures. In some embodiments, the duration over which the substrate is exposed to the gas mixture may be controlled. For instance, this duration may be about 0 minute to about 10 minutes. In some cases, the duration of exposure to the gas mixture may control the degree to which the materials on the substrate are etched. In other cases, the etching process may be self-limiting, such that additional exposure duration does not lead to additional etching of a targeted material.

In various embodiments, the temperature selected depends on the oxidant to be selected. Some oxidants can be used at high temperatures while others are used at low temperatures. The amount etched per cycle (where a cycle includes operations 203-209 of FIG. 2) depends on the oxidant selected and the temperature; because the oxidant chemistry and temperature can be selected to vary the amount etched, certain disclosed embodiments are suitable for a variety of applications for precise etching silicon for many different fabrication techniques.

In one example, where $O_2$ is used as the oxidant without other oxidants, the etching can be performed at a temperature of about 350° C. to about 400° C. Oxygen may be considered a mild or weak oxidant, and may etch about 0.3 Å to about 0.5 Å of silicon per cycle, depending on the removal gas and other process conditions, such as chamber pressure. Oxygen may be selected for etching about 0.5 nm to about 1 nm of silicon to a precision of about 0.2 nm to about 0.3 nm where precision refers to the variation of etching across regions of the feature (top, middle, bottom), across features across a wafer, or from wafer to wafer.

In one example, where $H_2O_2$ vapor is used as the oxidant without other oxidants, the etching can be performed at a temperature of about 100° C. to about 300° C. or about 200° C. Hydrogen peroxide may be considered a medium strength oxidant and may etch about 0.5 Å per cycle to about 1.5 Å per cycle.

In one example, where $N_2O$ is used as the oxidant without other oxidants, the etching can be performed at a temperature of about 100° C. to about 300° C. or about 200° C. Nitrous oxide may be considered a medium strength oxidant and may etch about 0.5 Å per cycle to about 1.5 Å per cycle.

In one example, where $O_3$ is used as the oxidant without other oxidants, the etching can be performed at a temperature about 50° C. to about 150° C. Ozone may be considered a strong oxidant and may etch about 1.5 Å per cycle to about 3.5 Å per cycle. Ozone may be selected for etching about 1 nm to about 10 nm of silicon to a precision of about 0.3 nm to about 0.7 nm or about 0.5 nm where precision refers to the variation of etching across regions of the feature (top, middle, bottom), across features across a wafer, or from wafer to wafer. Ozone can be used to achieve medium selectivity to oxide (about 5:1) and to spacer materials such as SiCO (about 10:1). This embodiment has the advantage that oxidation and etching can be run isothermally, which may result in faster cycling.

In the above four examples, plasma is not used.

In operation 207, a removal gas is flowed into the reaction chamber. In various embodiments, the removal gas includes a halogen source. In various embodiments, the halogen source is fluorine gas ($F_2$). In various embodiments, the removal gas is free of organic solvents, water, or both. In various embodiments, the removal gas is provided with a carrier gas. In some embodiments, the removal gas is hydrofluoric acid (HF) gas, or water ($H_2O$) vapor, or ammonia ($NH_3$) for salt-based oxide etching. In some embodiments, the removal gas is not an organic solvent.

In operation 209, the substrate is exposed to the removal gas to thereby etch the etchable oxide from the substrate. In cases where the substrate includes more than one material exposed, the modified material formed in operation 205 may be selectively etched away compared to other materials such as spacer materials, etc. At this point, some portion of the material targeted for removal has been modified and then removed from the substrate. In the example involving trimming silicon fins, this means that the silicon fins are now smaller/narrower than they were previously.

In various embodiments, removal is self-limiting such that only the material modified in operation 205 is removed in operation 209, allowing layer-by-layer etching and precise control of how much is etched by controlling how much is modified in operation 205.

In some embodiments, the removal gas is flowed with an additive. The amount of additive as well as other process conditions can affect the silicon to oxide etching selectivity as native oxide will etch at a different rate than other oxides, such as TEOS or flowable oxide. In embodiments where the removal gas includes an additive, the removal gas may be a reaction mixture having both a halogen source and additive. In the same or alternate embodiments, the reaction mixture may be characterized by halogen source:additive ratio (by volume). As described further below, in some embodiments, the selectivity can be tuned by the halogen source:additive vol. ratio with selectivity increasing with an increasing amount of additive (and thus a decreasing ratio). In some embodiments, the halogen source:additive ratio is less than or equal to 10. In some embodiments, the halogen:source additive ratio is greater than 10.

According to various embodiments, the reactive mixture may include a halogen source, an alcohol, and an amine, where the amine is about 0.1% wt to about 5% wt of the total alcohol and amine amounts. In some embodiments, the halogen source:amine volumetric ratio is no more than 10. In other embodiments, the halogen source:amine volumetric ratio is 10 or higher. In some embodiments, the amine is pyridine. In some embodiments, the alcohol is isopropyl alcohol. In some embodiment the halogen source is HF.

In some embodiments, salt-based etchants may be used for large critical dimension features, low aspect ratio features, or features with looser iso-dense loading results. One example is to use $HF/NH_3$ as the removal gas for salt-based etching.

Next, at operation 211, it is determined whether the etching process is sufficiently complete (e.g., whether a sufficient amount of material has been removed from the substrate). This determination may be made based on a number of factors including time, etch rate, thickness of material to be removed, etc. If it is determined that a sufficient amount of material has been removed from the substrate, then the method is complete. Otherwise, the method repeats, starting at operation 203. The surface modification and etching steps are cycled with one another until it is determined that a sufficient amount of material has been removed from the substrate.

In some embodiments, operations 203 and 205 are optional. Such embodiments may involve surface reaction-limited approaches. While etching is not self-limiting, etching is controlled using a time-controlled approach. In embodiments where operations 203 and 205 are not performed, etching is not self-limiting and is controlled primarily by toggling the temperature and duration of flowing removal gases during etching. Higher temperature results in faster and more etching. In some embodiments where operations 203 and 205 are optional, operation 207 is performed using fluorine gas at temperatures greater than about 50° C. or greater than about 80° C., or about 70° C. In some embodiments, temperatures greater than about 80° C. may be used, such as up to about 200° C., for bulk etching embodiments (e.g., etching more than about 10 nm of material). In various embodiments, without oxidation operations in operations 203 and 205, etching using $F_2$ vapor at less than about 50° C. results in little to no etching.

In another example where operations 203 and 205 are optional, the removal gas may include fluorine with one or more of the following gases: argon (Ar), helium (He), and nitrogen ($N_2$). In some embodiments, trichlorofluoride ($Cl_3F$) may be used. In various embodiments, diluted forms of $F_2/Ar$, or $F_2/He$, or $F_2/N_2$, or $Cl_3F$ are used.

In some embodiments, etching where operations 203 and 205 are not performed involve flowing a removal gas in addition to an inhibitor to mitigate or decrease the rate of etching. Example inhibitors include hydrofluorocarbons, hydrocarbons, $NH_3$, and combinations thereof. Some inhibitors have the chemical formula $C_xF_y$, where x is 1 or 4 and y is 4 or 8. In some embodiments, the inhibitor is methane ($CH_4$).

Definitions

Halogen Source he halogen source may be any halogen-containing (X-containing where X is fluorine (F), chlorine (Cl), bromine (Br), or iodine (I)) compound that exists in vapor phase at the processing temperature. Examples include HF, hydrogen chloride (HCl), hydrogen bromide (HBr), fluorine ($F_2$), chlorine ($Cl_2$), bromine ($Br_2$), chlorine trifluoride ($ClF_3$), nitrogen trifluoride ($NF_3$), nitrogen trichloride ($NCl_3$), and nitrogen tribromide ($NBr_3$). In some implementations, the halogen source is an organohalide, with examples including fluoroform ($CHF_3$), chloroform ($CHCl_3$), bromoform ($CHBr_3$), carbon tetrafluoride ($CF_4$), carbon tetrachloride ($CCl_4$), carbon tetrabromide ($CBr_4$), perfluorobutene ($C_4F_8$), and perchlorobutene ($C_4Cl_8$). In some implementations, the halogen source is a silicon halide, with examples including silicon tetrafluoride ($SiF_4$), silicon tetrachloride ($SiCl_4$), silicon tetrabromide ($SiBr_4$), and compounds that include $SiX_6$ such as $H_2SiX_6$. In some implementations, the halogen source is a metal halide with examples including molybdenum hexafluoride ($MoF_6$), molybdenum hexachloride ($MoCl_6$), molybdenum hexabromide ($MoBr_6$), tungsten hexafluoride ($WF_6$), tungsten hexachloride ($WCl_6$), tungsten hexabromide ($WBr_6$), titanium tetrafluoride ($TiF_4$), titanium tetrachloride ($TiCl_4$), titanium tetrabromide ($TiBr_4$), zirconium fluoride ($ZrF_4$), zirconium chloride ($ZrCl_4$), and zirconium bromide ($ZrBr_4$). Metal halides may be used in some embodiments to selectively etch metal oxides.

In the description below, various examples include HF as the halogen source. However, any appropriate halogen source may be used. The volume and mass percentages described for HF can be used for other halogen sources. In some embodiments, two or more halogen sources may be used.

Carrier Gas

The carrier gas may be an inert gas. In some cases the carrier gas is a noble gas. In certain embodiments, the carrier gas may be selected from the group consisting of $N_2$, He, Ne, Ar, Kr, and Xe. In some such embodiments, the carrier gas may be selected from the group consisting of $N_2$, He, and Ar.

Additive

The additive may be selected from a number of different types of additives. For instance, in some cases the additive may be a heterocycle compound, a heterocyclic aromatic compound, a halogen-substituted heterocyclic aromatic compound, a heterocyclic aliphatic compound, an amine, a fluoroamine, an amino acid, an organophosphorus compound, an oxidizer, a bifluoride source, ammonia, an aldehyde, a carbene, or an organic acid. In some cases, more than one additive may be used. In some embodiments, the additive may be a boron-containing Lewis acid or Lewis adduct. Boron trifluoride ($BF_3$) is an example of a Lewis acid that forms the acid-base adduct $BF_4^-$. In some cases, the additive may fall into two or more of the categories listed above. In various embodiments, the additive serves the purposes of accelerating the reaction rate and enhancing the reaction selectivity.

Heterocyclic Aromatic Compounds:

In certain embodiments, the additive is a heterocyclic aromatic compound. The term "aromatic" is defined above. A heterocyclic aromatic compound is an aromatic compound that includes a 5-, 6- or 7-membered ring, unless otherwise specified, containing one, two, three, or four non-carbon heteroatoms (e.g., independently selected from the group consisting of nitrogen, oxygen, phosphorous, sulfur, or halo). Example heterocyclic aromatic compounds that may be used include, but are not limited to, picoline, pyridine, pyrrole, imidazole, thiophene, N-methylimidazole, N-methylpyrrolidone, benzimidazole, 2,2-bipyridine, dipicolonic acid, 2,6-lutidine, 4-N,N-dimethylaminopyridine, and azulene. In some cases, a heterocyclic aromatic compound may be methylated. In some cases, a heterocyclic aromatic compound may follow the Hückel 4n+2 rule. In some cases, the additive is a halogen-substituted aromatic compound. A halogen-substituted aromatic compound is an aromatic compound that includes at least one halogen bonded to the aromatic ring. As used herein, halogen or halo refers to F, Cl, Br, or I. Example halogen-substituted aromatic compounds include, but are not limited to, 4-bromopyridine, chlorobenzene, 4-chlorotoluene, fluorobenzene, etc.

Heterocyclic Aliphatic Compounds:

In some embodiments, the additive is a heterocyclic aliphatic compound. As used herein, "aliphatic" means a hydrocarbon group having at least one carbon atom to 50 carbon atoms ($C_{1-50}$), such as one to 25 carbon atoms ($C_{1-25}$), or one to ten carbon atoms ($C_{1-10}$), and which includes alkanes (or alkyl), alkenes (or alkenyl), alkynes (or alkynyl), including cyclic versions thereof, and further including straight- and branched-chain arrangements, and all stereo and position isomers as well. A heterocyclic aliphatic compound is an aliphatic compound that includes a 5-, 6- or 7-membered ring, unless otherwise specified, containing one, two, three, or four non-carbon heteroatoms (e.g., independently selected from the group consisting of nitrogen, oxygen, phosphorous, sulfur, or halo). Example heterocyclic aliphatic compounds include pyrrolidine, piperidine, etc.

Amines:

In some embodiments, the additive is an amine having a formula of $NR^1R^2R^3$, where:

each of $R^1$, $R^2$, and $R^3$ is independently selected from hydrogen, hydroxyl, aliphatic, haloaliphatic, haloheteroaliphatic, heteroaliphatic, aromatic, aliphatic-aromatic, heteroaliphatic-aromatic, or any combinations thereof;

in which $R^1$ and $R^2$, taken together with the atom to which each are attached, can optionally form a cycloheteroaliphatic; and in which $R^1$, $R^2$, and $R^3$, taken together with the atom to which each are attached, can optionally form a cycloheteroaliphatic.

In some embodiments, each of $R^1$, $R^2$, and $R^3$ is independently selected from alkyl, alkenyl, alkynyl, heteroalkyl, heteroalkenyl, heteroalkynyl, haloalkyl, haloalkenyl, haloalkynyl, haloheteroalkyl, haloheteroalkenyl, haloheteroalkynyl, aryl, heterocyclyl, heteroaryl, alkyl-aryl, alkenyl-aryl, alkynyl-aryl, alkyl-heterocyclyl, alkenyl-heterocyclyl, alkynyl-heterocyclyl, alkyl-heteroaryl, alkenyl-heteroaryl, alkynyl-heteroaryl, heteroalkyl-aryl, heteroalkenyl-aryl, heteroalkynyl-aryl, heteroalkyl-heterocyclyl, heteroalkenyl-heterocyclyl, heteroalkynyl-heterocyclyl, heteroalkyl-heteroaryl, heteroalkenyl-heteroaryl, heteroalkynyl-heteroaryl, or any combinations thereof. In particular disclosed embodiments, the amine may further be substituted with one or more substituents, such as alkoxy, amide, amine, hydroxyl, thioether, thiol, acyloxy, silyl, cycloaliphatic, aryl, aldehyde, ketone, ester, carboxylic acid, acyl, acyl halide, cyano, halogen, sulfonate, nitro, nitroso, quaternary amine, pyridinyl (or pyridinyl wherein the nitrogen atom is functionalized with an aliphatic or aryl group), alkyl halide, or any combinations thereof.

In some embodiments, when at least one of $R^1$, $R^2$, and $R^3$ is aliphatic, haloaliphatic, haloheteroaliphatic, or heteroaliphatic, the additive is an alkyl amine. The alkyl amine can include dialkylamines, trialkyl amines, and derivatives thereof. Example alkyl amines include dimethylisopropylamine, N-ethyldiisopropylamine, trimethylamine, dimethylamine, methylamine, triethylamine, t-butyl amine, and the like.

In other embodiments, when at least one of $R^1$, $R^2$, and $R^3$ includes a hydroxyl, the additive is an alcohol amine. In one instance, at least one of $R^1$, $R^2$, and $R^3$ is an aliphatic group substituted with one or more hydroxyls. Example alcohol amines include 2-(dimethylamino)ethanol, 2-(diethylamino) ethanol, 2-(dipropylamino)ethanol, 2-(dibutylamino)ethanol, N-ethyldiethanolamine, N-tertbutyldiethanolamine, and the like.

In some embodiments, when $R^1$ and $R^2$, taken together with the atom to which each are attached, form a cycloheteroaliphatic, the additive can be a cyclic amine. Example cyclic amines include piperidine, N-alkyl piperidine (e.g., N-methyl piperidine, N-propyl piperidine, etc.), pyrrolidine, N-alkyl pyrrolidine (e.g., N-methyl pyrrolidine, N-propyl pyrrolidine, etc.), morpholine, N-alkyl morpholine (e.g., N-methyl morpholine, N-propyl morpholine, etc.), piperazine, N-alkyl piperazine, N,N-dialkyl piperazine (e.g., 1,4-dimethylpiperazine), and the like.

In other embodiments, when at least one of $R^1$, $R^2$, and $R^3$ includes an aromatic, the additive is an aromatic amine. In some embodiments, at least one of $R^1$, $R^2$, and $R^3$ is aromatic, aliphatic-aromatic, or heteroaliphatic-aromatic. In other embodiments, both $R^1$ and $R^2$ includes an aromatic. In yet other embodiments, $R^1$ and $R^2$ and optionally $R^3$, taken together with the atom to which each are attached, from a cycloheteroaliphatic that is an aromatic. Example aromatic amines include aniline, histamine, pyrrole, pyridine, imidazole, pyrimidine, and the derivatives thereof.

In some embodiments, the additive may include an amine selected from the group consisting of: methylamine, dimethylamine, trimethylamine, ethylamine, diethylamine, triethylamine, isopropylamine, 1,2-ethylenediamine, aniline (and aniline derivatives such as N,Ndimethylaniline), N-ethyldiisopropylamine, tert-butylamine, and combinations thereof.

In some embodiments, the additive may include a fluoramine. A fluoramine is an amine having one or more fluorinated substituents. Example fluoroamines that may be used include, but are not limited to, 4-trifluoromethylaniline.

In some embodiments, the additive can be a nitrogenous analogue of a carbonic acid, having a formula $R^1N$—C $(NR^2)$—$NR^3$. Example additives can include, but are not limited to, guanidine or derivatives thereof.

In some embodiments, the additive may be a relatively low molecular weight amine, e.g., having a molecular weight of less than 200 g/mol or 100 g/mol in certain embodiments. Higher molecular weight amines, including those having long chains and/or heterocyclic compounds with aromatic rings, may be used in some embodiments.

Amino Acids:

In some embodiments, the additive may include an amino acid. The amino acid may have a formula of R—CH $(NR'_2)$—COOH, where:

each R and R' independently are hydroxyl, aliphatic, haloaliphatic, haloheteroaliphatic, heteroaliphatic, aromatic, aliphatic-aromatic, heteroaliphatic-aromatic, or any combination thereof.

Example amino acids that may be used include, but are not limited to, histidine, alanine, and derivatives thereof.

Organophosphorus Compounds:

In some embodiments, the additive may include an organophosphorus compound. The organophosphorus compound may be a phosphate ester, a phosphate amide, a phosphonic acid, a phosphinic acid, a phosphonate, a phosphinate, a phosphine oxide, a phosphine imide, or a phosphonium salt. Example organophosphorus compounds include phosphoric acid and trialkylphosphate. In some cases, the organophosphorous compound is a phosphazene. A phosphazene is an organophosphorus compound that includes phosphorus (V) with a double bond between P and N. The phosphazene may have a formula of $RN$=$P(NR_2)_3$ (where each of R and $R^2$ are independently selected from hydroxyl, aliphatic, haloaliphatic, haloheteroaliphatic, heteroaliphatic, aromatic, aliphatic-aromatic, heteroaliphatic-aromatic, or any combination thereof). In some cases, the phosphazene may have a formula of $[X_2PN]_n$ (where X is a halide, alkoxide, or amide). Other types of phosphazenes may be used as desired.

Oxidizers:

In some embodiments, the additive includes an oxidizer. As used herein, an oxidizer is a material that has the ability to oxidize (e.g., accept electrons from) another substance. Example oxidizers that may be used include, but are not limited to, hydrogen peroxide, sodium hypochlorate, and tetramethyl ammonium hydroxide.

Bifluoride Sources:

In some embodiments, the additive includes a bifluoride source. A bifluoride source is a material that includes or produces bifluoride ($HF_2^-$). Example bifluoride sources that may be used include, but are not limited to, ammonium fluoride, aqueous HF, gaseous HF, buffered oxide etch mixture (e.g., a mixture of HF and a buffering agent such as ammonium fluoride), and hydrogen fluoride pyridine. In some embodiments, the bifluoride source (and/or one or more of the other additives listed herein) may react to form $HF_2^-$ before or after delivery to the reaction chamber.

Aldehydes:

In some embodiments, the additive includes an aldehyde having a formula of X—[C(O)]—H, where:

X can be selected from hydrogen, —$R^1$, —$C(R^2)_3$ or —$[C(R^3)_2]_m$—C(O)H, wherein each $R^1$, $R^2$ and $R^3$ independently are selected from hydrogen, aliphatic, haloaliphatic, haloheteroaliphatic, heteroaliphatic, aromatic, aliphatic-aromatic, heteroaliphatic-aromatic, or any combinations thereof, and m is an integer from 0 to 10.

In some embodiments, each of $R^1$, $R^2$, and $R^3$ is, independently, alkyl, alkenyl, alkynyl, heteroalkyl, heteroalkenyl, heteroalkynyl, haloalkyl, haloalkenyl, haloalkynyl, haloheteroalkyl, haloheteroalkenyl, haloheteroalkynyl, aryl, heterocyclyl, heteroaryl, alkyl-aryl, alkenyl-aryl, alkynyl-aryl, alkyl-heterocyclyl, alkenyl-heterocyclyl, alkynyl-heterocyclyl, alkyl-heteroaryl, alkenyl-heteroaryl, alkynyl-heteroaryl, heteroalkyl-aryl, heteroalkenyl-aryl, heteroalkynyl-aryl, heteroalkyl-heterocyclyl, heteroalkenyl-heterocyclyl, heteroalkynyl-heterocyclyl, heteroalkyl-heteroaryl, heteroalkenyl-heteroaryl, heteroalkynyl-heteroaryl, or any combinations thereof. In particular disclosed embodiments, the aldehyde or ketone may further be substituted with one or more substituents, such as aldehyde (—C(O)H), oxo (=O), alkoxy, amide, amine, hydroxyl, thioether, thiol, acyloxy, silyl, cycloaliphatic, aryl, aldehyde, ketone, ester, carboxylic acid, acyl, acyl halide, cyano, halogen, sulfonate, nitro, nitroso, quaternary amine, pyridinyl (or pyridinyl wherein the nitrogen atom is functionalized with an aliphatic or aryl group), alkyl halide, or any combinations thereof.

In some embodiments, when X=aromatic, the additive can be an aromatic aldehyde. Example aromatic aldehydes include benzaldehyde, 1-naphthaldehyde, phthalaldehyde, and the like.

In other embodiments, when X=aliphatic, the additive can be an aliphatic aldehyde. Example aliphatic aldehydes include acetaldehyde, propionaldehyde, butyraldehyde, isovalerylaldehyde, and the like.

In yet other embodiments, when X=—$[C(R^3)_2]_m$—C(O)H and m is 0 to 10 or when X=aliphatic or heteroaliphatic substituted with —C(O)H, the additive can be a dialdehyde. Example dialdehydes include glyoxal, phthalaldehyde, glutaraldehyde, malondialdehyde, succinaldehyde, and the like.

In some examples, an aldehyde used as an additive may be selected from the group consisting of: acrolein, acetaldehyde, formaldehyde, benzaldehyde, propionaldehyde, butyraldehyde, cinnamaldehyde, vanillin, and tolualdehyde. In these or other cases, an aldehyde used as an additive may be selected from the aldehydes discussed in this section and the aldehydes discussed in the organic solvent section.

Carbenes:

In some embodiments, the additive includes a carbene. The carbene may have a formula of X—(C:)—Y, where:

each of X and Y can be independently selected from H, halo, —$[C(R^1)_2]_m$—$C(R^2)_3$, —C(O)—$R^1$, or —C(=$NR^1$)—$R^2$, —$NR^1R^2$, —$OR^2$, —$SR^2$, or —$C(R^2)_3$, wherein each of $R^1$ and $R^2$ is independently selected from hydrogen, hydroxyl, aliphatic, haloaliphatic, haloheteroaliphatic, heteroaliphatic, aromatic, aliphatic-aromatic, heteroaliphatic-aromatic, or any combinations thereof, and wherein m is an integer from 0 to 10;

in which $R^1$ and $R^2$, taken together with the atom to which each are attached, can optionally form a cycloheteroaliphatic group; and in which X and Y, taken together with the atom to which each are attached, can optionally form a cycloaliphatic or cycloheteroaliphatic group.

Furthermore, the additive can be a carbenium cation having a formula $R^1$—$C^+$(R)—$R^2$, wherein each of R, $R^1$, and $R^2$ is independently selected from hydrogen, aliphatic, haloaliphatic, haloheteroaliphatic, heteroaliphatic, aromatic, aliphatic-aromatic, heteroaliphatic-aromatic, or any combinations thereof.

In some embodiments, each R, $R^1$, and $R^2$ independently is selected from alkyl, alkenyl, alkynyl, heteroalkyl, heteroalkenyl, heteroalkynyl, haloalkyl, haloalkenyl, haloalkynyl, haloheteroalkyl, haloheteroalkenyl, haloheteroalkynyl, aryl, heterocyclyl, heteroaryl, alkyl-aryl, alkenyl-aryl, alkynyl-aryl, alkyl-heterocyclyl, alkenyl-heterocyclyl, alkynyl-heterocyclyl, alkyl-heteroaryl, alkenyl-heteroaryl, alkynyl-heteroaryl, heteroalkyl-aryl, heteroalkenyl-aryl, heteroalkynyl-aryl, heteroalkyl-heterocyclyl, heteroalkenyl-heterocyclyl, heteroalkynyl-heterocyclyl, heteroalkyl-heteroaryl, heteroalkenyl-heteroaryl, heteroalkynyl-heteroaryl, or any combinations thereof. In particular disclosed embodiments, the carbene may further be substituted with one or more substituents, such as alkoxy, amide, amine, hydroxyl, thioether, thiol, acyloxy, silyl, cycloaliphatic, aryl, aldehyde, ketone, ester, carboxylic acid, acyl, acyl halide, cyano, halogen, sulfonate, nitro, nitroso, quaternary amine, pyridinyl (or pyridinyl wherein the nitrogen atom is functionalized with an aliphatic or aryl group), alkyl halide, or any combinations thereof. In any embodiment of a carbene, each of $R^1$ and $R^2$ can be independently selected.

In some embodiments, when at least one of X or Y is halo, the additive can be a halocarbene. Example, non-limiting halocarbenes include dihalocarbene, such as dichlorocarbene, difluorocarbene, and the like.

In some embodiments, when both X=Y=—$NR^1R^2$, the additive can be a diaminocarbene. In one instance, each of $R^1$ and $R^2$ is independently aliphatic. Example diaminocarbenes include bis(diisopropylamino) carbene.

In other embodiments, when both at least one of X or Y=—$NR^1R^2$ and both $R^1$ and $R^2$ within X or within Y are taken together, with the nitrogen atom to which each are attached, to form a cycloheteroaliphatic group, the additive can be a cyclic diaminocarbene. Example cyclic diamino carbenes include bis(N-piperidyl) carbene, bis(N-pyrrolidinyl) carbene, and the like.

In one instance, when both X=Y=—$NR^1R^2$ and an $R^1$ group from X and an $R^2$ group from Y are taken together, with the nitrogen atom to which each are attached, to form a cycloheteroaliphatic group, the additive is an N-heterocyclic carbene. Example N-heterocyclic carbenes include imidazol-2-ylidenes (e.g., 1,3-dimesitylimidazol-2-ylidene, 1,3-dimesityl-4,5-dichloroimidazol-2-ylidene, 1,3-bis (2,6-diisopropylphenyl)imidazol-2-ylidene, 1,3-di-tert-butylimidazol-2-ylidene, etc.), imidazolidin-2-ylidenes (e.g., 1,3-bis (2,6-diisopropylphenyl)imidazolidin-2-ylidene), triazol-5-ylidenes (e.g., 1,3,4-triphenyl-4,5-dihydro-1H-1,2,4-triazol-5-ylidene), and the like.

In some embodiments, when X=—$NR^1R^2$ and Y=—$SR^2$ and an $R^1$ group from X and an $R^2$ group from Y are taken together, with the nitrogen atom to which each are attached, to form a cycloheteroaliphatic group, the additive is an example cyclic thioalkyl amino carbene. Example cyclic thioalkyl amino carbenes include thiazol-2-ylidenes (e.g., 3-(2,6-diisopropylphenyl)thiazol-2-ylidene and the like).

In some embodiments, when X=—$NR^1R^2$ and Y=—C $(R^2)_3$ and an $R^1$ group from X and an $R^2$ group from Y are taken together, with the atom to which each are attached, to form a cycloheteroaliphatic group, the additive is an example cyclic alkyl amino carbene. Example cyclic alkyl amino carbenes include pyrrolidine-2-ylidenes (e.g., 1,3,3, 5,5-pentamethyl-pyrrolidin-2-ylidene and the like) and piperidin-2-ylidenes (e.g., 1,3,3,6,6-pentamethyl-piperidin-2-ylidene and the like).

Further example carbenes and derivatives thereof include compounds having a thiazol-2-ylidene moiety, a dihydroimidazol-2-ylidene moiety, an imidazol-2-ylidene moiety, a triazol-5-ylidene moiety, or a cyclopropenylidene moiety. Yet other carbenes and carbene analogs include an aminothiocarbene compound, an aminooxycarbene compound, a diaminocarbene compound, a heteroamino carbene compound, a 1,3-dithiolium carbene compound, a mesoionic carbene compound (e.g., an imidazolin-4-ylidene compound, a 1,2,3-triazolylidene compound, a pyrazolinylidene compound, a tetrazol-5-ylidene compound, an isoxazol-4-ylidene compound, a thiazol-5-ylidene compound, etc.), a cyclic alkyl amino carbene compound, a boranylidene compound, a silylene compound, a stannylene compound, a nitrene compound, a phosphinidene compound, a foiled carbene compound, etc. Further example carbenes include dimethyl imidazol-2-ylidene, 1,3-bis(2,4,6-trimethylphenyl)-4,5-dihydroimidazol-2-ylidene, (phosphanyl)(trifluoromethyl)carbene, bis(diisopropylamino)carbene, bis(diisopropylamino) cyclopropenylidene, 1,3-dimesityl-4,5-dichloroimidazol-2-ylidene, 1,3-diadamantylimidazol-2-ylidene, 1,3,4,5-tetramethylimidazol-2-ylidene, 1,3-dimesitylimidazol-2-ylidene, 1,3-dimesitylimidazol-2-ylidene, 1,3,5-triphenyltriazol-5-ylidene, bis (diisopropylamino) cyclopropenylidene, bis(9-anthryl) carbene, norbornen-7-ylidene, dihydroimidazol-2-ylidene, methylidenecarbene, etc.

Organic Acids:

In some embodiments, the additive includes an organic acid. The organic acid may have a formula of R—$CO_2H$, wherein R is selected from hydrogen, aliphatic, haloaliphatic, haloheteroaliphatic, heteroaliphatic, aromatic, aliphatic-aromatic, heteroaliphatic-aromatic or any combinations thereof. In certain embodiments, R is alkyl, alkenyl, alkynyl, heteroalkyl, heteroalkenyl, heteroalkynyl, haloalkyl, haloalkenyl, haloalkynyl, haloheteroalkyl, haloheteroalkenyl, haloheteroalkynyl, aryl, heteroaryl, alkyl-aryl, alkenyl-aryl, alkynyl-aryl, alkyl-heteroaryl, alkenyl-heteroaryl, alkynyl-heteroaryl, heteroalkyl-aryl, heteroalkenyl-aryl, heteroalkynyl-aryl, heteroalkyl-heteroaryl, heteroalkenyl-heteroaryl, heteroalkynyl-heteroaryl or any combinations thereof. In particular disclosed embodiments, R may further be substituted with one or more substituents such as, alkoxy, amide, amine, thioether, hydroxyl, thiol, acyloxy, silyl, cycloaliphatic, aryl, aldehyde, ketone, ester, carboxylic acid, acyl, acyl halide, cyano, halogen, sulfonate, nitro, nitroso, quaternary amine, pyridinyl (or pyridinyl wherein the nitrogen atom is functionalized with an aliphatic or aryl group), alkyl halide or any combinations thereof. In certain implementations, the organic acid may be selected from formic acid and acetic acid.

Substitutions:

Any of the example materials described herein include unsubstituted and/or substituted forms of the compound. Non-limiting example substituents include, e.g., one, two, three, four, or more substituents independently selected from the group consisting of: (1) $C_{1-6}$ alkoxy (e.g., —O—R, in which R is $C_{1-6}$ alkyl); (2) $C_{1-6}$ alkylsulfinyl (e.g., —S(O)—R, in which R is $C_{1-6}$ alkyl); (3) $C_{1-6}$ alkylsulfonyl (e.g., —$SO_2$—R, in which R is $C_{1-6}$ alkyl); (4) amine (e.g., —C(O)NR$^1$R$^2$ or —NHCOR$^1$, where each of R$^1$ and R$^2$ is, independently, selected from hydrogen, aliphatic, heteroaliphatic, haloaliphatic, haloheteroaliphatic, aromatic, as defined herein, or any combination thereof, or R$^1$ and R$^2$, taken together with the nitrogen atom to which each are attached, form a heterocyclyl group, as defined herein); (5) aryl; (6) arylalkoxy (e.g., —O-L-R, in which L is alkyl and R is aryl); (7) aryloyl (e.g., —C(O)—R, in which R is aryl); (8) azido (e.g., —$N_3$); (9) cyano (e.g., —CN); (10) aldehyde (e.g., —C(O)H); (11) $C_{3-8}$ cycloalkyl; (12) halo; (13) heterocyclyl (e.g., as defined herein, such as a 5-, 6- or 7-membered ring containing one, two, three, or four non-carbon heteroatoms); (14) heterocyclyloxy (e.g., —O—R, in which R is heterocyclyl, as defined herein); (15) heterocyclyloyl (e.g., —C(O)—R, in which R is heterocyclyl, as defined herein); (16) hydroxyl (e.g., —OH); (17) N-protected amino; (18) nitro (e.g., —$NO_2$); (19) oxo (e.g., =O); (20) $C_{1-6}$ thioalkoxy (e.g., —S—R, in which R is $C_{1-6}$ alkyl); (21) thiol (e.g., —SH); (22) —$CO_2R^1$, where R$^1$ is selected from the group consisting of (a) hydrogen, (b) $C_{1-6}$ alkyl, (c) $C_{4-18}$ aryl, and (d) $C_{1-6}$ alkyl-$C_{4-18}$ aryl (e.g., -L-R, in which L is $C_{1-6}$ alkyl and R is $C_{4-18}$ aryl); (23) —C(O)NR$^1$R$^2$, where each of R$^1$ and R$^2$ is, independently, selected from the group consisting of (a) hydrogen, (b) $C_{1-6}$ alkyl, (c) $C_{4-18}$ aryl, and (d) $C_{1-6}$ alkyl-$C_{4-18}$ aryl (e.g., -L-R, in which L is $C_{1-6}$ alkyl and R is $C_{4-18}$ aryl); (24) —$SO_2R^1$, where R$^1$ is selected from the group consisting of (a) $C_{1-6}$ alkyl, (b) $C_{4-18}$ aryl, and (c) $C_{1-6}$ alkyl-$C_{4-18}$ aryl (e.g., -L-R, in which L is $C_{1-6}$ alkyl and R is $C_{4-18}$ aryl); (25) —$SO_2NR^1R^2$, where each of R$^1$ and R$^2$ is, independently, selected from the group consisting of (a) hydrogen, (b) $C_{1-6}$ alkyl, (c) $C_{4-18}$ aryl, and (d) $C_{1-6}$ alkyl-$C_{4-18}$ aryl (e.g., -L-R, in which L is $C_{1-6}$ alkyl and R is $C_{4-18}$ aryl); and (26) —NR$^1$R$^2$, where each of R$^1$ and R$^2$ is, independently, selected from the group consisting of (a) hydrogen, (b) an N-protecting group, (c) $C_{1-6}$ alkyl, (d) $C_{2-6}$ alkenyl, (e) $C_{2-6}$ alkynyl, (f) $C_{4-18}$ aryl, (g) $C_{1-6}$ alkyl-$C_{4-18}$ aryl (e.g., -L-R, in which L is $C_{1-6}$ alkyl and R is $C_{4-18}$ aryl), (h) $C_{3-8}$ cycloalkyl, and (i) $C_{1-6}$ alkyl-$C_{3-8}$ cycloalkyl (e.g., -L-R, in which L is $C_{1-6}$ alkyl and R is $C_{3-8}$ cycloalkyl), wherein in one embodiment no two groups are bound to the nitrogen atom through a carbonyl group or a sulfonyl group.

In certain embodiments, the additive may act as a proton acceptor and promote formation of $HF_2^-$. In some such cases, the $HF_2^-$ may actively etch one or more materials on the substrate such as an oxide material or another material.

Additional Definitions

This section presents additional definitions that may be used herein. Some of the materials described in this section may overlap with those presented elsewhere in the application.

The term "acyl," or "alkanoyl," as used interchangeably herein, represents groups of 1, 2, 3, 4, 5, 6, 7, 8 or more carbon atoms of a straight, branched, cyclic configuration, saturated, unsaturated and aromatic, and combinations thereof, or hydrogen, attached to the parent molecular group through a carbonyl group, as defined herein. This group is exemplified by formyl, acetyl, propionyl, isobutyryl, butanoyl, and the like. In some embodiments, the acyl or alkanoyl group is —C(O)—R, in which R is hydrogen, an aliphatic group, or an aromatic group, as defined herein.

By "acyl halide" is meant —C(O)X, where X is a halogen, such as Br, F, I, or Cl.

By "aldehyde" is meant a —C(O)H group.

By "aliphatic" is meant a hydrocarbon group having at least one carbon atom to 50 carbon atoms ($C_{1-50}$), such as one to 25 carbon atoms ($C_{1-25}$), or one to ten carbon atoms ($C_{1-10}$), and which includes alkanes (or alkyl), alkenes (or alkenyl), alkynes (or alkynyl), including cyclic versions thereof, and further including straight- and branched-chain arrangements, and all stereo and position isomers as well.

By "alkyl-aryl," "alkenyl-aryl," and "alkynyl-aryl" is meant an aryl group, as defined herein, that is or can be coupled (or attached) to the parent molecular group through an alkyl, alkenyl, or alkynyl group, respectively, as defined herein. The alkyl-aryl, alkenyl-aryl, and/or alkynyl-aryl group can be substituted or unsubstituted. For example, the alkyl-aryl, alkenyl-aryl, and/or alkynyl-aryl group can be substituted with one or more substitution groups, as described herein for alkyl, alkenyl, alkynyl, and/or aryl. Example unsubstituted alkyl-aryl groups are of from 7 to 16 carbons ($C_{7-16}$ alkyl-aryl), as well as those having an alkyl group with 1 to 6 carbons and an aryl group with 4 to 18 carbons (i.e., $C_{1-6}$ alkyl-$C_{4-18}$ aryl). Example unsubstituted alkenyl-aryl groups are of from 7 to 16 carbons ($C_{7-16}$ alkenyl-aryl), as well as those having an alkenyl group with 2 to 6 carbons and an aryl group with 4 to 18 carbons (i.e., $C_{2-6}$ alkenyl-$C_{4-18}$ aryl). Example unsubstituted alkynyl-aryl groups are of from 7 to 16 carbons ($C_{7-16}$ alkynyl-aryl), as well as those having an alkynyl group with 2 to 6 carbons and an aryl group with 4 to 18 carbons (i.e., $C_{2-6}$ alkynyl-$C_{4-18}$ aryl). In some embodiments, the alkyl-aryl group is -L-R, in which L is an alkyl group, as defined herein, and R is an aryl group, as defined herein. In some embodiments, the alkenyl-aryl group is -L-R, in which L is an alkenyl group, as defined herein, and R is an aryl group, as defined herein. In some embodiments, the alkynyl-aryl group is -L-R, in which L is an alkynyl group, as defined herein, and R is an aryl group, as defined herein.

By "alkenyl" is meant an unsaturated monovalent hydrocarbon having at least two carbon atom to 50 carbon atoms ($C_{2-50}$), such as two to 25 carbon atoms ($C_{2-25}$), or two to ten carbon atoms ($C_{2-10}$), and at least one carbon-carbon double bond, wherein the unsaturated monovalent hydrocarbon can be derived from removing one hydrogen atom from one carbon atom of a parent alkene. An alkenyl group can be branched, straight-chain, cyclic (e.g., cycloalkenyl), cis, or trans (e.g., E or Z). An example alkenyl includes an optionally substituted $C_{2-24}$ alkyl group having one or more double bonds. The alkenyl group can be monovalent or multivalent (e.g., bivalent) by removing one or more hydrogens to form appropriate attachment to the parent molecular group or appropriate attachment between the parent molecular group and another substitution. The alkenyl group can also be substituted or unsubstituted. For example, the alkenyl group can be substituted with one or more substitution groups, as described herein for alkyl.

By "alkyl-heteroaryl" is meant a heteroaryl group, as defined herein, attached to the parent molecular group through an alkyl group, as defined herein. In some embodiments, the alkyl-heteroaryl group is -L-R, in which L is an alkyl group, as defined herein, and R is a heteroaryl group, as defined herein.

By "alkyl-heterocyclyl," "alkenyl-heterocyclyl," and "alkynyl-heterocyclyl" is meant a heterocyclyl group, as defined herein, that is or can be coupled (or attached) to the parent molecular group through an alkyl, alkenyl, or alkynyl group, respectively, as defined herein. The alkyl-heterocyclyl, alkenyl-heterocyclyl, and/or alkynyl-heterocyclyl group can be substituted or unsubstituted. For example, the alkyl-heterocyclyl, alkenyl-heterocyclyl, and/or alkynyl-heterocyclyl group can be substituted with one or more substitution groups, as described herein for alkyl, alkenyl, alkynyl, and/or heterocyclyl. Example unsubstituted alkyl-heterocyclyl groups are of from 2 to 16 carbons ($C_{2-16}$ alkyl-heterocyclyl), as well as those having an alkyl group with 1 to 6 carbons and a heterocyclyl group with 1 to 18 carbons (i.e., $C_{1-6}$ alkyl-$C_{1-18}$ heterocyclyl). Example unsubstituted alkenyl-heterocyclyl groups are of from 3 to 16 carbons ($C_{3-16}$ alkenyl-heterocyclyl), as well as those having an alkenyl group with 2 to 6 carbons and a heterocyclyl group with 1 to 18 carbons (i.e., $C_{2-6}$ alkenyl-$C_{1-18}$ heterocyclyl). Example unsubstituted alkynyl-heterocyclyl groups are of from 3 to 16 carbons ($C_{3-16}$ alkynyl-heterocyclyl), as well as those having an alkynyl group with 2 to 6 carbons and a heterocyclyl group with 1 to 18 carbons (i.e., $C_{2-6}$ alkynyl-$C_{1-18}$ heterocyclyl). In some embodiments, the alkyl-heterocyclyl group is -L-R, in which L is an alkyl group, as defined herein, and R is a heterocyclyl group, as defined herein. In some embodiments, the alkenyl-heterocyclyl group is -L-R, in which L is an alkenyl group, as defined herein, and R is a heterocyclyl group, as defined herein. In some embodiments, the alkynyl-heterocyclyl group is -L-R, in which L is an alkynyl group, as defined herein, and R is a heterocyclyl group, as defined herein.

By "alkoxy" is meant —OR, where R is an optionally substituted aliphatic group, as described herein. Example alkoxy groups include, but are not limited to, methoxy, ethoxy, n-propoxy, isopropoxy, n-butoxy, t-butoxy, sec-butoxy, n-pentoxy, trihaloalkoxy, such as trifluoromethoxy, etc. The alkoxy group can be substituted or unsubstituted. For example, the alkoxy group can be substituted with one or more substitution groups, as described herein for alkyl. Example unsubstituted alkoxy groups include $C_{1-3}$, $C_{1-6}$, $C_{1-12}$, $C_{1-16}$, $C_{1-18}$, $C_{1-20}$, or $C_{1-24}$ alkoxy groups.

By "alkyl" is meant a saturated monovalent hydrocarbon having at least one carbon atom to 50 carbon atoms ($C_{1-50}$), such as one to 25 carbon atoms ($C_{1-25}$), or one to ten carbon atoms ($C_{1-10}$), wherein the saturated monovalent hydrocarbon can be derived from removing one hydrogen atom from one carbon atom of a parent compound (e.g., alkane). An alkyl group can be branched, straight-chain, or cyclic (e.g., cycloalkyl). An example alkyl includes a branched or unbranched saturated hydrocarbon group of 1 to 24 carbon atoms, such as methyl, ethyl, n-propyl, isopropyl, n-butyl, isobutyl, s-butyl, t-butyl, n-pentyl, isopentyl, s-pentyl, neopentyl, hexyl, heptyl, octyl, nonyl, decyl, dodecyl, tetradecyl, hexadecyl, eicosyl, tetracosyl, and the like. The alkyl group can also be substituted or unsubstituted. The alkyl group can be monovalent or multivalent (e.g., bivalent) by removing one or more hydrogens to form appropriate attachment to the parent molecular group or appropriate attachment between the parent molecular group and another substitution. For example, the alkyl group can be substituted with one, two, three or, in the case of alkyl groups of two carbons or more, four substituents independently selected from the group consisting of: (1) $C_{1-6}$ alkoxy (e.g., —O—R, in which R is $C_{1-6}$ alkyl); (2) $C_{1-6}$ alkylsulfinyl (e.g., —S(O)—R, in which R is $C_{1-6}$ alkyl); (3) $C_{1-6}$ alkylsulfonyl (e.g., —SO$_2$—R, in which R is $C_{1-6}$ alkyl); (4) amine (e.g., —C(O)NR$^1$R$^2$ or —NHCOR$^1$, where each of R$^1$ and R$^2$ is, independently, selected from hydrogen, aliphatic, heteroaliphatic, haloaliphatic, haloheteroaliphatic, aromatic, as defined herein, or any combination thereof, or R$^1$ and R$^2$, taken together with the nitrogen atom to which each are attached, form a heterocyclyl group, as defined herein); (5) aryl; (6) arylalkoxy (e.g., —O-L-R, in which L is alkyl and R is aryl); (7) aryloyl (e.g., —C(O)—R, in which R is aryl); (8) azido (e.g., —N$_3$); (9) cyano (e.g., —CN); (10) aldehyde (e.g., —C(O)H); (11) $C_{3-8}$ cycloalkyl; (12) halo; (13) heterocyclyl (e.g., as defined herein, such as a 5-, 6- or 7-membered ring containing one, two, three, or four non-carbon heteroatoms); (14) heterocyclyloxy (e.g., —O—R, in which R is heterocyclyl, as defined herein); (15) heterocyclyloyl (e.g., —C(O)—R, in which R is heterocyclyl, as defined herein); (16) hydroxyl (e.g., —OH); (17) N-protected amino; (18) nitro (e.g., —NO$_2$); (19) oxo (e.g., ═O); (20) $C_{1-6}$ thioalkoxy (e.g., —S—R, in which R is alkyl); (21) thiol (e.g., —SH); (22) —CO$_2$R$^1$, where R$^1$ is selected from the group consisting of (a) hydrogen, (b) $C_{1-6}$ alkyl, (c) $C_{4-18}$ aryl, and (d) $C_{1-6}$ alkyl-$C_{4-18}$ aryl (e.g., -L-R, in which L is $C_{1-6}$ alkyl and R is $C_{4-18}$ aryl); (23) —C(O)NR$^1$R$^2$, where each of R$^1$ and R$^2$ is, independently, selected from the group consisting of (a) hydrogen, (b) $C_{1-6}$ alkyl, (c) $C_{4-18}$ aryl, and (d) $C_{1-6}$ alkyl-$C_{4-18}$ aryl (e.g., -L-R, in which L is $C_{1-6}$ alkyl and R is $C_{4-18}$ aryl); (24) —SO$_2$R$^1$, where R$^1$ is selected from the group consisting of (a) $C_{1-6}$ alkyl, (b) $C_{4-18}$ aryl, and (c) $C_{1-6}$ alkyl-$C_{4-18}$ aryl (e.g., -L-R, in which L is $C_{1-6}$ alkyl and R is $C_{4-18}$ aryl); (25) —SO$_2$NR$^1$R$^2$, where each of R$^1$ and R$^2$ is, independently, selected from the group consisting of (a) hydrogen, (b) $C_{1-6}$ alkyl, (c) $C_{4-18}$ aryl, and (d) $C_{1-6}$ alkyl-$C_{4-18}$ aryl (e.g., -L-R, in which L is $C_{1-6}$ alkyl and R is $C_{4-18}$ aryl); and (26) —NR$^1$R$^2$, where each of R$^1$ and R$^2$ is, independently, selected from the group consisting of (a) hydrogen, (b) an N-protecting group, (c) $C_{1-6}$ alkyl, (d) $C_{2-6}$ alkenyl, (e) $C_{2-6}$ alkynyl, (f) $C_{4-18}$ aryl, (g) $C_{1-6}$ alkyl-$C_{4-18}$ aryl (e.g., -L-R, in which L is $C_{1-6}$ alkyl and R is $C_{4-18}$ aryl), (h) $C_{3-8}$ cycloalkyl, and (i) $C_{1-6}$ alkyl-$C_{3-8}$ cycloalkyl (e.g., -L-R, in which L is $C_{1-6}$ alkyl and R is $C_{3-8}$ cycloalkyl), wherein in one embodiment no two groups are bound to the nitrogen atom through a carbonyl group or a sulfonyl group. The alkyl group can be a primary, secondary, or tertiary alkyl group substituted with one or more substituents (e.g., one or more halo or alkoxy). In some embodiments, the unsubstituted alkyl group is a $C_{1-3}$, $C_{1-6}$, $C_{1-12}$, $C_{1-16}$, $C_{1-18}$, $C_{1-20}$, or $C_{1-24}$ alkyl group.

By "alkylsulfinyl" is meant an alkyl group, as defined herein, attached to the parent molecular group through an —S(O)— group. In some embodiments, the unsubstituted alkylsulfinyl group is a $C_{1-6}$ or $C_{1-12}$ alkylsulfinyl group. In other embodiments, the alkylsulfinyl group is —S(O)—R, in which R is an alkyl group, as defined herein.

By "alkylsulfonyl" is meant an alkyl group, as defined herein, attached to the parent molecular group through an —SO$_2$— group. In some embodiments, the unsubstituted alkylsulfonyl group is a $C_{1-6}$ or $C_{1-12}$ alkylsulfonyl group. In other embodiments, the alkylsulfonyl group is —SO$_2$—R, where R is an optionally substituted alkyl (e.g., as described herein, including optionally substituted $C_{1-12}$ alkyl, haloalkyl, or perfluoroalkyl).

By "alkynyl" is meant an unsaturated monovalent hydrocarbon having at least two carbon atom to 50 carbon atoms ($C_{2-50}$), such as two to 25 carbon atoms ($C_{2-25}$), or two to ten carbon atoms ($C_{2-10}$), and at least one carbon-carbon triple bond, wherein the unsaturated monovalent hydrocarbon can be derived from removing one hydrogen atom from one carbon atom of a parent alkyne. An alkynyl group can be branched, straight-chain, or cyclic (e.g., cycloalkynyl). An example alkynyl includes an optionally substituted $C_{2-24}$ alkyl group having one or more triple bonds. The alkynyl group can be cyclic or acyclic and is exemplified by ethynyl, 1-propynyl, and the like. The alkynyl group can be monovalent or multivalent (e.g., bivalent) by removing one or more hydrogens to form appropriate attachment to the parent molecular group or appropriate attachment between the parent molecular group and another substitution. The alkynyl group can also be substituted or unsubstituted. For example, the alkynyl group can be substituted with one or more substitution groups, as described herein for alkyl.

By "amide" is mean —C(O)NR$^1$R$^2$ or —NHCOR$^1$, where each of R$^1$ and R$^2$ is, independently, selected from hydrogen, aliphatic, heteroaliphatic, haloaliphatic, haloheteroaliphatic, aromatic, as defined herein, or any combination thereof, or R$^1$ and R$^2$, taken together with the nitrogen atom to which each are attached, form a heterocyclyl group, as defined herein.

By "amine" is meant —NR$^1$R$^2$, where each of R$^1$ and R$^2$ is, independently, selected from hydrogen, aliphatic, heteroaliphatic, haloaliphatic, haloheteroaliphatic, aromatic, as defined herein, or any combination thereof, or R$^1$ and R$^2$, taken together with the nitrogen atom to which each are attached, form a heterocyclyl group, as defined herein.

By "aminoalkyl" is meant an alkyl group, as defined herein, substituted by an amine group, as defined herein. In some embodiments, the aminoalkyl group is -L-NR$^1$R$^2$, in which L is an alkyl group, as defined herein, and each of R$^1$ and R$^2$ is, independently, selected from hydrogen, aliphatic, heteroaliphatic, haloaliphatic, haloheteroaliphatic, aromatic, as defined herein, or any combination thereof, or R$^1$ and R$^2$, taken together with the nitrogen atom to which each are attached, form a heterocyclyl group, as defined herein. In other embodiments, the aminoalkyl group is -L-C(NR$^1$R$^2$)(R$^3$)—R$^4$, in which L is a covalent bond or an alkyl group, as defined herein; each of R$^1$ and R$^2$ is, independently, selected from hydrogen, aliphatic, heteroaliphatic, haloaliphatic, haloheteroaliphatic, aromatic, as defined herein, or any combination thereof, or R$^1$ and R$^2$, taken together with the nitrogen atom to which each are attached, form a heterocyclyl group, as defined herein; and each of R$^3$ and R$^4$ is, independently, H or alkyl, as defined herein.

By "aromatic" is meant a cyclic, conjugated group or moiety of, unless specified otherwise, from 5 to 15 ring atoms having a single ring (e.g., phenyl) or multiple condensed rings in which at least one ring is aromatic (e.g., naphthyl, indolyl, or pyrazolopyridinyl); that is, at least one ring, and optionally multiple condensed rings, have a continuous, delocalized π-electron system. Typically, the number of out of plane π-electrons corresponds to the Huckel rule (4n+2). The point of attachment to the parent structure typically is through an aromatic portion of the condensed ring system.

By "aryl" is meant an aromatic carbocyclic group comprising at least five carbon atoms to 15 carbon atoms ($C_{5-15}$), such as five to ten carbon atoms ($C_{5-10}$), having a single ring or multiple condensed rings, which condensed rings can or may not be aromatic provided that the point of attachment to a remaining position of the compounds disclosed herein is through an atom of the aromatic carbocyclic group. Aryl groups may be substituted with one or more groups other than hydrogen, such as aliphatic, heteroaliphatic, aromatic, other functional groups, or any combination thereof. Example aryl groups include, but are not limited to, benzyl, naphthalene, phenyl, biphenyl, phenoxybenzene, and the like. The term aryl also includes heteroaryl, which is defined as a group that contains an aromatic group that has at least one heteroatom incorporated within the ring of the aromatic group. Examples of heteroatoms include, but are not limited to, nitrogen, oxygen, sulfur, and phosphorus. Likewise, the term non-heteroaryl, which is also included in the term aryl, defines a group that contains an aromatic group that does not contain a heteroatom. The aryl group can be substituted or unsubstituted. The aryl group can be substituted with one, two, three, four, or five substituents independently selected from the group consisting of: (1) $C_{1-6}$ alkanoyl (e.g., —C(O)—R, in which R is $C_{1-6}$ alkyl); (2) $C_{1-6}$ alkyl; (3) $C_{1-6}$ alkoxy (e.g., —O—R, in which R is $C_{1-6}$ alkyl); (4) $C_{1-6}$ alkoxy-$C_{1-6}$ alkyl (e.g., -L-O—R, in which each of L and R is, independently, $C_{1-6}$ alkyl); (5) $C_{1-6}$ alkylsulfinyl (e.g., —S(O)—R, in which R is $C_{1-6}$ alkyl); (6) $C_{1-6}$ alkylsulfinyl-$C_{1-6}$ alkyl (e.g., -L-S(O)—R, in which each of L and R is, independently, $C_{1-6}$ alkyl); (7) $C_{1-6}$ alkylsulfonyl (e.g., —SO$_2$—R, in which R is $C_{1-6}$ alkyl); (8) $C_{1-6}$ alkylsulfonyl-$C_{1-6}$ alkyl (e.g., -L-SO$_2$—R, in which each of L and R is, independently, $C_{1-6}$ alkyl); (9) aryl; (10) amine (e.g., —NR$^1$R$^2$, where each of R$^1$ and R$^2$ is, independently, selected from hydrogen, aliphatic, heteroaliphatic, haloaliphatic, haloheteroaliphatic, aromatic, as defined herein, or any combination thereof, or R$^1$ and R$^2$, taken together with the nitrogen atom to which each are attached, form a heterocyclyl group, as defined herein); (11) $C_{1-6}$ aminoalkyl (e.g., -L$^1$-NR$^1$R$^2$ or -L$^2$-C(NR$^1$R$^2$)(R$^3$)—R$^4$, in which L$^1$ is $C_{1-6}$ alkyl; L2 is a covalent bond or $C_{1-6}$ alkyl; each of R$^1$ and R$^2$ is, independently, selected from hydrogen, aliphatic, heteroaliphatic, haloaliphatic, haloheteroaliphatic, aromatic, as defined herein, or any combination thereof, or $R^1$ and $R^2$, taken together with the nitrogen atom to which each are attached, form a heterocyclyl group, as defined herein; and each of $R^3$ and $R^4$ is, independently, H or $C_{1-6}$ alkyl); (12) heteroaryl; (13) $C_{1-6}$ alkyl-$C_{4-18}$ aryl (e.g., -L-R, in which L is $C_{1-6}$ alkyl and R is $C_{4-18}$ aryl); (14) aryloyl (e.g., —C(O)—R, in which R is aryl); (15) azido (e.g., —$N_3$); (16) cyano (e.g., —CN); (17) $C_{1-6}$ azidoalkyl (e.g., -L-$N_3$, in which L is $C_{1-6}$ alkyl); (18) aldehyde (e.g., —C(O)H); (19) aldehyde-$C_{1-6}$ alkyl (e.g., -L-C(O)H, in which L is $C_{1-6}$ alkyl); (20) $C_{3-8}$ cycloalkyl; (21) $C_{1-6}$ alkyl-$C_{3-8}$ cycloalkyl (e.g., -L-R, in which L is $C_{1-6}$ alkyl and R is $C_{3-8}$ cycloalkyl); (22) halo; (23) $C_{1-6}$ haloalkyl (e.g., -$L^1$-X or -$L^2$-C(X)($R^1$)—$R^2$, in which $L^1$ is $C_{1-6}$ alkyl; $L^2$ is a covalent bond or $C_{1-6}$ alkyl; X is fluoro, bromo, chloro, or iodo; and each of $R^1$ and $R^2$ is, independently, H or $C_{1-6}$ alkyl); (24) heterocyclyl (e.g., as defined herein, such as a 5-, 6- or 7-membered ring containing one, two, three, or four non-carbon heteroatoms); (25) heterocyclyloxy (e.g., —O—R, in which R is heterocyclyl, as defined herein); (26) heterocyclyloyl (e.g., —C(O)—R, in which R is heterocyclyl, as defined herein); (27) hydroxyl (—OH); (28) $C_{1-6}$ hydroxyalkyl (e.g., -$L^1$-OH or -$L^2$-C(OH)($R^1$)—$R^2$, in which $L^1$ is $C_{1-6}$ alkyl; $L^2$ is a covalent bond or alkyl; and each of $R^1$ and $R^2$ is, independently, H or $C_{1-6}$ alkyl, as defined herein); (29) nitro; (30) $C_{1-6}$ nitroalkyl (e.g., -$L^1$-NO or -$L^2$-C(NO)($R^1$)—$R^2$, in which $L^1$ is $C_{1-6}$ alkyl; $L^2$ is a covalent bond or alkyl; and each of $R^1$ and $R^2$ is, independently, H or $C_{1-6}$ alkyl, as defined herein); (31) N-protected amino; (32) N-protected amino-$C_{1-6}$ alkyl; (33) oxo (e.g., =O); (34) $C_{1-6}$ thioalkoxy (e.g., —S—R, in which R is $C_{1-6}$ alkyl); (35) thio-$C_{1-6}$ alkoxy-$C_{1-6}$ alkyl (e.g., -L-S—R, in which each of L and R is, independently, $C_{1-6}$ alkyl); (36) —(CH$_2$)$_r$CO$_2$R$^1$, where r is an integer of from zero to four, and $R^1$ is selected from the group consisting of (a) hydrogen, (b) $C_{1-6}$ alkyl, (c) $C_{4-18}$ aryl, and (d) $C_{1-6}$ alkyl-$C_{4-18}$ aryl (e.g., -L-R, in which L is $C_{1-6}$ alkyl and R is $C_{4-18}$ aryl); (37) —(CH$_2$)$_r$CONR$^1$R$^2$, where r is an integer of from zero to four and where each $R^1$ and $R^2$ is independently selected from the group consisting of (a) hydrogen, (b) $C_{1-6}$ alkyl, (c) $C_{4-18}$ aryl, and (d) $C_{1-6}$ alkyl-$C_{4-18}$ aryl (e.g., -L-R, in which L is $C_{1-6}$ alkyl and R is $C_{4-18}$ aryl); (38) —(CH$_2$)$_r$SO$_2$R$^1$, where r is an integer of from zero to four and where $R^1$ is selected from the group consisting of (a) $C_{1-6}$ alkyl, (b) $C_{4-18}$ aryl, and (c) $C_{1-6}$ alkyl-$C_{4-18}$ aryl (e.g., -L-R, in which L is $C_{1-6}$ alkyl and R is $C_{4-18}$ aryl); (39) —(CH$_2$)$_r$SO$_2$NR$^1$R$^2$, where r is an integer of from zero to four and where each of $R^1$ and $R^2$ is, independently, selected from the group consisting of (a) hydrogen, (b) $C_{1-6}$ alkyl, (c) $C_{4-18}$ aryl, and (d) $C_{1-6}$ alkyl-$C_{4-18}$ aryl (e.g., -L-R, in which L is $C_{1-6}$ alkyl and R is $C_{4-18}$ aryl); (40) —(CH$_2$)$_r$NR$^1$R$^2$, where r is an integer of from zero to four and where each of $R^1$ and $R^2$ is, independently, selected from the group consisting of (a) hydrogen, (b) an N-protecting group, (c) $C_{1-6}$ alkyl, (d) $C_{2-6}$ alkenyl, (e) $C_{2-6}$ alkynyl, (f) $C_{4-18}$ aryl, (g) $C_{1-6}$ alkyl-$C_{4-18}$ aryl (e.g., -L-R, in which L is $C_{1-6}$ alkyl and R is $C_{4-18}$ aryl), (h) $C_{3-8}$ cycloalkyl, and (i) $C_{1-6}$ alkyl-$C_{3-8}$ cycloalkyl (e.g., -L-R, in which L is $C_{1-6}$ alkyl and R is $C_{3-8}$ cycloalkyl), wherein in one embodiment no two groups are bound to the nitrogen atom through a carbonyl group or a sulfonyl group; (41) thiol (e.g., —SH); (42) perfluoroalkyl (e.g., —(CF$_2$)$_n$CF$_3$, in which n is an integer from 0 to 10); (43) perfluoroalkoxy (e.g., —O—(CF$_2$)$_n$CF$_3$, in which n is an integer from 0 to 10); (44) aryloxy (e.g., —O—R, in which R is aryl); (45) cycloalkoxy (e.g., —O—R, in which R is cycloalkyl); (46) cycloalkyl-alkoxy (e.g., —O-L-R, in which L is alkyl and R is cycloalkyl); and (47) arylalkoxy (e.g., —O-L-R, in which L is alkyl and R is aryl). In particular embodiments, an unsubstituted aryl group is a $C_{4-18}$, $C_{4-14}$, $C_{4-12}$, $C_{4-10}$, $C_{6-18}$, $C_{6-14}$, $C_{6-12}$, or $C_{6-10}$ aryl group.

By "arylalkoxy" is meant an alkyl-aryl group, as defined herein, attached to the parent molecular group through an oxygen atom. In some embodiments, the arylalkoxy group is —O-L-R, in which L is an alkyl group, as defined herein, and R is an aryl group, as defined herein.

By "aryloxy" is meant —OR, where R is an optionally substituted aryl group, as described herein. In some embodiments, an unsubstituted aryloxy group is a $C_{4-18}$ or $C_{6-18}$ aryloxy group.

By "aryloyl" is meant an aryl group that is attached to the parent molecular group through a carbonyl group. In some embodiments, an unsubstituted aryloyl group is a $C_{7-11}$ aryloyl or $C_{5-19}$ aryloyl group. In other embodiments, the aryloyl group is —C(O)—R, in which R is an aryl group, as defined herein.

By "azido" is meant an —$N_3$ group.

By "azidoalkyl" is meant an azido group attached to the parent molecular group through an alkyl group, as defined herein. In some embodiments, the azidoalkyl group is -L-$N_3$, in which L is an alkyl group, as defined herein. By "azo" is meant an —N=N— group.

By "carbene" is meant $H_2C$: and derivatives thereof having carbon bearing two nonbonding electrons or (C:). In some embodiments, the carbene is $R^1R^2$(C:), where each of $R^1$ and $R^2$ is, independently, selected from hydrogen, aliphatic, heteroaliphatic, haloaliphatic, haloheteroaliphatic, aromatic, as defined herein, or any combination thereof, or $R^1$ and $R^2$, taken together with the atom to which each are attached, form a cycloaliphatic group, as defined herein.

By "carbenium cation" is meant $H_3C^+$ and derivatives thereof having carbon bearing a +1 formal charge or $C^+$. In some embodiments, the carbenium cation is $R^1$—$C^+$(R)—$R^2$, where each of R, $R^1$, and $R^2$ is, independently, selected from hydrogen, aliphatic, heteroaliphatic, haloaliphatic, haloheteroaliphatic, aromatic, as defined herein, or any combination thereof, or $R^1$ and $R^2$ and optionally R, taken together with the atom to which each are attached, form a cycloaliphatic group, as defined herein.

By "carbonyl" is meant a —C(O)— group, which can also be represented as >C=O.

By "carboxyl" is meant a —CO$_2$H group or an anion thereof.

By "cyano" is meant a —CN group.

By "cycloaliphatic" is meant an aliphatic group, as defined herein, that is cyclic.

By "cycloalkoxy" is meant a cycloalkyl group, as defined herein, attached to the parent molecular group through an oxygen atom. In some embodiments, the cycloalkoxy group is —O—R, in which R is a cycloalkyl group, as defined herein.

By "cycloalkylalkoxy" is meant an alkyl-cycloalkyl group, as defined herein, attached to the parent molecular group through an oxygen atom. In some embodiments, the cycloalkylalkoxy group is —O-L-R, in which L is an alkyl group, as defined herein, and R is a cycloalkyl group, as defined herein.

By "cycloalkyl" is meant a monovalent saturated or unsaturated non-aromatic cyclic hydrocarbon group of from three to eight carbons, unless otherwise specified, and is exemplified by cyclopropyl, cyclobutyl, cyclopentyl, cyclohexyl, cycloheptyl, bicyclo[2.2.1.heptyl, and the like. The cycloalkyl group can also be substituted or unsubstituted.

For example, the cycloalkyl group can be substituted with one or more groups including those described herein for alkyl.

By "cycloheteroaliphatic" is meant a heteroaliphatic group, as defined herein, that is cyclic.

By "ester" is meant —C(O)OR —OC(O)R, where R is selected from aliphatic, heteroaliphatic, haloaliphatic, halo-heteroaliphatic, aromatic, as defined herein, or any combination thereof.

By "halo" is meant F, Cl, Br, or I.

By "haloaliphatic" is meant an aliphatic group, as defined herein, in which one or more hydrogen atoms, such as one to 10 hydrogen atoms, independently is replaced with a halogen atom, such as fluoro, bromo, chloro, or iodo.

By "haloalkyl" is meant an alkyl group, as defined herein, where one or more hydrogen atoms, such as one to 10 hydrogen atoms, independently is replaced with a halogen atom, such as fluoro, bromo, chloro, or iodo. In an independent embodiment, haloalkyl can be a —$CX_3$ group, wherein each X independently can be selected from fluoro, bromo, chloro, or iodo. In some embodiments, the haloalkyl group is -L-X, in which L is an alkyl group, as defined herein, and X is fluoro, bromo, chloro, or iodo. In other embodiments, the halooalkyl group is -L-C(X)($R^1$)—$R^2$, in which L is a covalent bond or an alkyl group, as defined herein; X is fluoro, bromo, chloro, or iodo; and each of $R^1$ and $R^2$ is, independently, H or alkyl, as defined herein.

By "haloheteroaliphatic" is meant a heteroaliphatic, as defined herein, in which one or more hydrogen atoms, such as one to 10 hydrogen atoms, independently is replaced with a halogen atom, such as fluoro, bromo, chloro, or iodo.

By "heteroaliphatic" is meant an aliphatic group, as defined herein, including at least one heteroatom to 20 heteroatoms, such as one to 15 heteroatoms, or one to 5 heteroatoms, which can be selected from, but not limited to oxygen, nitrogen, sulfur, silicon, boron, selenium, phosphorous, and oxidized forms thereof within the group.

By "heteroalkyl," "heteroalkenyl," and "heteroalkynyl" is meant an alkyl, alkenyl, or alkynyl group (which can be branched, straight-chain, or cyclic), respectively, as defined herein, including at least one heteroatom to 20 heteroatoms, such as one to 15 heteroatoms, or one to 5 heteroatoms, which can be selected from, but not limited to, oxygen, nitrogen, sulfur, silicon, boron, selenium, phosphorous, and oxidized forms thereof within the group.

By "heteroalkyl-aryl," "heteroalkenyl-aryl," and "heteroalkynyl-aryl" is meant an aryl group, as defined herein, that is or can be coupled to a compound disclosed herein, where the aryl group is or becomes coupled through a heteroalkyl, heteroalkenyl, or heteroalkynyl group, respectively, as defined herein. In some embodiments, the heteroalkyl-aryl group is -L-R, in which L is a heteroalkyl group, as defined herein, and R is an aryl group, as defined herein. In some embodiments, the heteroalkenyl-aryl group is -L-R, in which L is a heteroalkenyl group, as defined herein, and R is an aryl group, as defined herein. In some embodiments, the heteroalkynyl-aryl group is -L-R, in which L is a heteroalkynyl group, as defined herein, and R is an aryl group, as defined herein.

By "heteroalkyl-heteroaryl," "heteroalkenyl-heteroaryl," and "heteroalkynyl-heteroaryl" is meant a heteroaryl group, as defined herein, that is or can be coupled to a compound disclosed herein, where the heteroaryl group is or becomes coupled through a heteroalkyl, heteroalkenyl, or heteroalkynyl group, respectively, as defined herein. In some embodiments, the heteroalkyl-heteroaryl group is -L-R, in which L is a heteroalkyl group, as defined herein, and R is a heteroaryl group, as defined herein. In some embodiments, the heteroalkenyl-heteroaryl group is -L-R, in which L is a heteroalkenyl group, as defined herein, and R is a heteroaryl group, as defined herein. In some embodiments, the heteroalkynyl-heteroaryl group is -L-R, in which L is a heteroalkynyl group, as defined herein, and R is a heteroaryl group, as defined herein.

By "heteroaryl" is meant an aryl group including at least one heteroatom to six heteroatoms, such as one to four heteroatoms, which can be selected from, but not limited to, oxygen, nitrogen, sulfur, silicon, boron, selenium, phosphorous, and oxidized forms thereof within the ring. Such heteroaryl groups can have a single ring or multiple condensed rings, where the condensed rings may or may not be aromatic and/or contain a heteroatom, provided that the point of attachment is through an atom of the aromatic heteroaryl group. Heteroaryl groups may be substituted with one or more groups other than hydrogen, such as aliphatic, heteroaliphatic, aromatic, other functional groups, or any combination thereof. An example heteroaryl includes a subset of heterocyclyl groups, as defined herein, which are aromatic, i.e., they contain 4n+2 pi electrons within the mono- or multicyclic ring system.

By "heteroatom" is meant an atom other than carbon, such as oxygen, nitrogen, sulfur, silicon, boron, selenium, or phosphorous. In particular disclosed embodiments, such as when valency constraints do not permit, a heteroatom does not include a halogen atom.

By "heterocyclyl" is meant a 5-, 6- or 7-membered ring, unless otherwise specified, containing one, two, three, or four non-carbon heteroatoms (e.g., independently selected from the group consisting of nitrogen, oxygen, phosphorous, sulfur, or halo). The 5-membered ring has zero to two double bonds and the 6- and 7-membered rings have zero to three double bonds. The term "heterocyclyl" also includes bicyclic, tricyclic and tetracyclic groups in which any of the above heterocyclic rings is fused to one, two, or three rings independently selected from the group consisting of an aryl ring, a cyclohexane ring, a cyclohexene ring, a cyclopentane ring, a cyclopentene ring, and another monocyclic heterocyclic ring, such as indolyl, quinolyl, isoquinolyl, tetrahydroquinolyl, benzofuryl, benzothienyl and the like. Heterocyclics include thiiranyl, thietanyl, tetrahydrothienyl, thianyl, thiepanyl, aziridinyl, azetidinyl, pyrrolidinyl, piperidinyl, azepanyl, pyrrolyl, pyrrolinyl, pyrazolyl, pyrazolinyl, pyrazolidinyl, imidazolyl, imidazolinyl, imidazolidinyl, pyridyl, homopiperidinyl, pyrazinyl, piperazinyl, pyrimidinyl, pyridazinyl, oxazolyl, oxazolidinyl, oxazolidonyl, isoxazolyl, isoxazolidiniyl, morpholinyl, thiomorpholinyl, thiazolyl, thiazolidinyl, isothiazolyl, isothiazolidinyl, indolyl, quinolinyl, isoquinolinyl, benzimidazolyl, benzothiazolyl, benzoxazolyl, furyl, thienyl, thiazolidinyl, isothiazolyl, isoindazoyl, triazolyl, tetrazolyl, oxadiazolyl, uricyl, thiadiazolyl, pyrimidyl, tetrahydrofuranyl, dihydrofuranyl, dihydrothienyl, dihydroindolyl, tetrahydroquinolyl, tetrahydroisoquinolyl, pyranyl, dihydropyranyl, tetrahydropyranyl, dithiazolyl, dioxanyl, dioxinyl, dithianyl, trithianyl, oxazinyl, thiazinyl, oxothiolanyl, triazinyl, benzofuranyl, benzothienyl, and the like.

By "heterocyclyloxy" is meant a heterocyclyl group, as defined herein, attached to the parent molecular group through an oxygen atom. In some embodiments, the heterocyclyloxy group is —O—R, in which R is a heterocyclyl group, as defined herein.

By "heterocyclyloyl" is meant a heterocyclyl group, as defined herein, attached to the parent molecular group through a carbonyl group. In some embodiments, the heterocyclyloyl group is —C(O)—R, in which R is a hetero-cyclyl group, as defined herein.

By "hydroxyl" is meant —OH.

By "hydroxyalkyl" is meant an alkyl group, as defined herein, substituted by one to three hydroxyl groups, with the proviso that no more than one hydroxyl group may be attached to a single carbon atom of the alkyl group and is exemplified by hydroxymethyl, dihydroxypropyl, and the like. In some embodiments, the hydroxyalkyl group is -L-OH, in which L is an alkyl group, as defined herein. In other embodiments, the hydroxyalkyl group is -L-C(OH)$(R^1)$—$R^2$, in which L is a covalent bond or an alkyl group, as defined herein, and each of $R^1$ and $R^2$ is, independently, H or alkyl, as defined herein.

By "ketone" is meant —C(O)R, where R is selected from aliphatic, heteroaliphatic, aromatic, as defined herein, or any combination thereof.

By "nitro" is meant an —$NO_2$ group.

By "nitroalkyl" is meant an alkyl group, as defined herein, substituted by one to three nitro groups. In some embodiments, the nitroalkyl group is -L-NO, in which L is an alkyl group, as defined herein. In other embodiments, the nitroalkyl group is -L-C(NO)$(R^1)$—$R^2$, in which L is a covalent bond or an alkyl group, as defined herein, and each of $R^1$ and $R^2$ is, independently, H or alkyl, as defined herein.

By "oxo" is meant an =O group.

By "oxy" is meant —O—.

By "perfluoroalkyl" is meant an alkyl group, as defined herein, having each hydrogen atom substituted with a fluorine atom. Example perfluoroalkyl groups include trifluoromethyl, pentafluoroethyl, etc. In some embodiments, the perfluoroalkyl group is —$(CF_2)_nCF_3$, in which n is an integer from 0 to 10.

By "perfluoroalkoxy" is meant an alkoxy group, as defined herein, having each hydrogen atom substituted with a fluorine atom. In some embodiments, the perfluoroalkoxy group is —O—R, in which R is a perfluoroalkyl group, as defined herein.

By "salt" is meant an ionic form of a compound or structure (e.g., any formulas, compounds, or compositions described herein), which includes a cation or anion compound to form an electrically neutral compound or structure. Salts are well known in the art. For example, non-toxic salts are described in Berge S M et al., "Pharmaceutical salts," *J. Pharm. Sci.* 1977 January; 66(1):1-19; and in "Handbook of Pharmaceutical Salts: Properties, Selection, and Use," Wiley-VCH, April 2011 (2nd rev. ed., eds. P. H. Stahl and C. G. Wermuth. The salts can be prepared in situ during the final isolation and purification of the compounds of the invention or separately by reacting the free base group with a suitable organic acid (thereby producing an anionic salt) or by reacting the acid group with a suitable metal or organic salt (thereby producing a cationic salt). Representative anionic salts include acetate, adipate, alginate, ascorbate, aspartate, benzenesulfonate, benzoate, bicarbonate, bisulfate, bitartrate, borate, bromide, butyrate, camphorate, camphorsulfonate, chloride, citrate, cyclopentanepropionate, digluconate, dihydrochloride, diphosphate, dodecylsulfate, edetate, ethanesulfonate, fumarate, glucoheptonate, gluconate, glutamate, glycerophosphate, hemisulfate, heptonate, hexanoate, hydrobromide, hydrochloride, hydroiodide, hydroxyethanesulfonate, hydroxynaphthoate, iodide, lactate, lactobionate, laurate, lauryl sulfate, malate, maleate, malonate, mandelate, mesylate, methanesulfonate, methylbromide, methylnitrate, methylsulfate, mucate, 2-naphthalenesulfonate, nicotinate, nitrate, oleate, oxalate, palmitate, pamoate, pectinate, persulfate, 3-phenylpropionate, phosphate, picrate, pivalate, polygalacturonate, propionate, salicylate, stearate, subacetate, succinate, sulfate, tannate, tartrate, theophyllinate, thiocyanate, triethiodide, toluenesulfonate, undecanoate, valerate salts, and the like. Representative cationic salts include metal salts, such as alkali or alkaline earth salts, e.g., barium, calcium (e.g., calcium edetate), lithium, magnesium, potassium, sodium, and the like; other metal salts, such as aluminum, bismuth, iron, and zinc; as well as nontoxic ammonium, quaternary ammonium, and amine cations, including, but not limited to ammonium, tetramethylammonium, tetraethylammonium, methylamine, dimethylamine, trimethylamine, triethylamine, ethylamine, pyridinium, and the like. Other cationic salts include organic salts, such as chloroprocaine, choline, dibenzylethylenediamine, diethanolamine, ethylenediamine, methylglucamine, and procaine. Yet other salts include ammonium, sulfonium, sulfoxonium, phosphonium, iminium, imidazolium, benzimidazolium, amidinium, guanidinium, phosphazinium, phosphazenium, pyridinium, etc., as well as other cationic groups described herein (e.g., optionally substituted isoxazolium, optionally substituted oxazolium, optionally substituted thiazolium, optionally substituted pyrrolium, optionally substituted furanium, optionally substituted thiophenium, optionally substituted imidazolium, optionally substituted pyrazolium, optionally substituted isothiazolium, optionally substituted triazolium, optionally substituted tetrazolium, optionally substituted furazanium, optionally substituted pyridinium, optionally substituted pyrimidinium, optionally substituted pyrazinium, optionally substituted triazinium, optionally substituted tetrazinium, optionally substituted pyridazinium, optionally substituted oxazinium, optionally substituted pyrrolidinium, optionally substituted pyrazolidinium, optionally substituted imidazolinium, optionally substituted isoxazolidinium, optionally substituted oxazolidinium, optionally substituted piperazinium, optionally substituted piperidinium, optionally substituted morpholinium, optionally substituted azepanium, optionally substituted azepinium, optionally substituted indolium, optionally substituted isoindolium, optionally substituted indolizinium, optionally substituted indazolium, optionally substituted benzimidazolium, optionally substituted isoquinolinum, optionally substituted quinolizinium, optionally substituted dehydroquinolizinium, optionally substituted quinolinium, optionally substituted isoindolinium, optionally substituted benzimidazolinium, and optionally substituted purinium).

By "sulfo" is meant an —$S(O)_2OH$ group.

By "sulfonyl" or "sulfonate" is meant an —$S(O)_2$—group or a —$SO_2R$, where R is selected from hydrogen, aliphatic, heteroaliphatic, haloaliphatic, haloheteroaliphatic, aromatic, as defined herein, or any combination thereof.

By "thioalkoxy" is meant an alkyl group, as defined herein, attached to the parent molecular group through a sulfur atom. Example unsubstituted thioalkoxy groups include $C_{1-6}$ thioalkoxy. In some embodiments, the thioalkoxy group is —S—R, in which R is an alkyl group, as defined herein.

By "thiol" is meant an —SH group.

A person of ordinary skill in the art would recognize that the definitions provided above are not intended to include impermissible substitution patterns (e.g., methyl substituted with 5 different groups, and the like). Such impermissible substitution patterns are easily recognized by a person of ordinary skill in the art. Any functional group disclosed herein and/or defined above can be substituted or unsubstituted, unless otherwise indicated therein.

Apparatus

The methods described herein can be performed on any appropriate apparatus. The following description provides one example of an appropriate apparatus. The apparatus described herein allows for rapidly and precisely controlling a substrate's temperature during semiconductor processing, including performing etching using thermal energy, rather than or in addition to plasma energy, to drive the modification and removal operations. In certain embodiments, etching that relies upon chemical reactions in conjunction with primarily thermal energy, not a plasma, to drive the chemical reactions in the modification and removal operations may be considered "thermal etching." This etching is not limited to atomic layer etching (ALE); it is applicable to any etching technique.

In certain embodiments, thermal etching processes, such as those employing one or more thermal cycles have relatively fast heating and cooling and relatively precise temperature control. In some cases, these features may be leveraged to provide good throughput and/or to reduce nonuniformity and wafer defects.

Many conventional etching apparatuses do not have the ability to adjust and control the temperature of the substrate with adequate speed. For example, while some etching apparatuses may be able to heat a substrate to multiple temperatures, they can do so only slowly, or they may not be able to reach the desired temperature ranges, or they may not be able to maintain the substrate temperature for the desired time and at the desired temperature ranges. Similarly, typical etching apparatuses are often unable to cool the substrate fast enough to enable high throughput or cool the substrate to the desired temperature ranges. For some applications, it is desirable to reduce the temperature ramp times as much as possible, such as to less than about 120 seconds in some embodiments, but many conventional etching apparatuses cannot heat, cool, or both, a substrate in less than that time; it may take some apparatuses multiple minutes to cool and/or heat a substrate, which slows throughput.

In various embodiments, apparatuses described herein are designed or configured to rapidly heat and cool a wafer, and precisely control a wafer's temperature. In some embodiments, the wafer is rapidly heated and its temperature is precisely controlled using, in part, visible light emitted from light emitting diodes (LEDs) positioned in a pedestal under the wafer. The visible light may have wavelengths that include and range of about 400 nanometers (nm) to about 800 nm. The pedestal may include various features for enabling wafer temperature control, such as a transparent window that may have lensing for advantageously directing or focusing the emitted light, reflective material also for advantageously directing or focusing the emitted light, and temperature control elements that assist with temperature control of the LEDs, the pedestal, and the chamber.

The apparatuses may also thermally isolate, or thermally "float," the wafer within the processing chamber so that only the smallest thermal mass is heated, the ideal smallest thermal mass being just the substrate itself, which enables faster heating and cooling. The wafer may be rapidly cooled using a cooling gas and radiative heat transfer to a heat sink, such as a top plate (or other gas distribution element) above the wafer, or both. In some instances, the apparatus also includes temperature control elements within the processing chamber walls, pedestal, and top plate (or other gas distribution element), to enable further temperature control of the wafer and processing conditions within the chamber, such the prevention of unwanted condensation of processing gases and vapors.

The apparatuses may also be configured to implement various control loops to precisely control the wafer and the chamber temperatures (e.g., with a controller configured to execute instructions that cause the apparatus to perform these loops). This may include the use of various sensors that determine wafer and chamber temperatures as part of open loops and feedback control loops. These sensors may include temperature sensors in the wafer supports which contact the wafer and measure its temperature, and non-contact sensors such as photodetectors to measure light output of the LEDs and a pyrometer configured to measure the temperature of different types of wafers. As described in more detail below, traditional pyrometers determine an item's temperature by emitting infrared or other optical signals at the item and measuring the signals reflected or emitted by the item. However, many silicon wafers cannot be measured by traditional pyrometers because the silicon can be optically transparent at various temperatures and with various treatments, e.g., doped or low doped silicon. For example, a low doped silicon wafer at a temperature less than 200° C. is transparent to infrared signals. The novel pyrometers provided herein are able to measure multiple types of silicon wafers at various temperatures.

Figure 3:
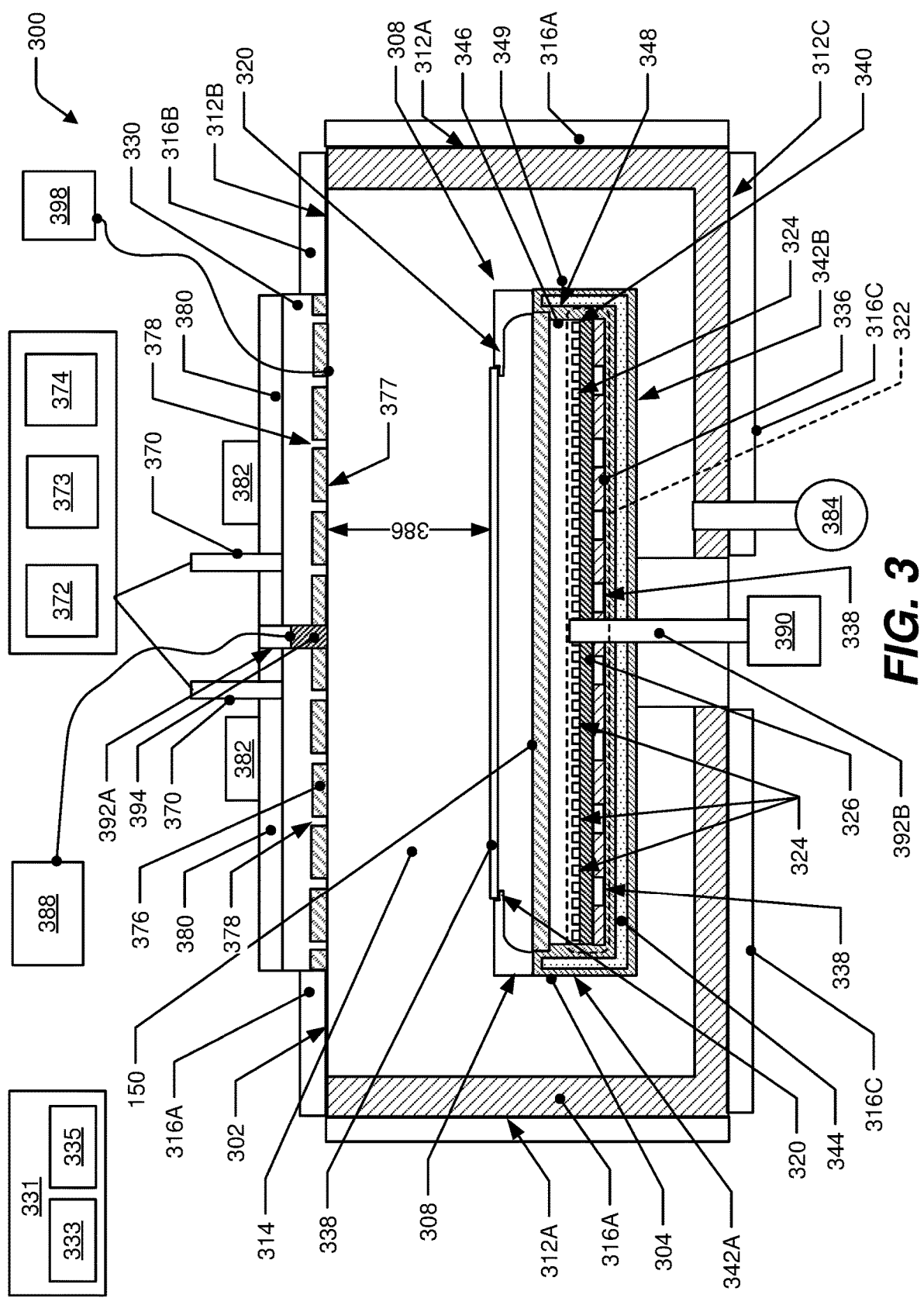
FIG. 3 depicts a cross-sectional side view of an example apparatus in accordance with disclosed embodiments.

FIG. 3 depicts a cross-sectional side view of an example apparatus in accordance with disclosed embodiments. This apparatus may be used to perform any of the methods described herein, for example using the chemistry described herein. As detailed below, this apparatus 300 is capable of rapidly and precisely controlling the temperature of a substrate, including performing thermal etching operations. The apparatus 300 includes a processing chamber 302, a pedestal 304 having a substrate heater 306 and a plurality of substrates supports 308 configured to support a substrate 318, and a gas distribution unit 310.

The processing chamber 302 includes sides walls 312A, a top 312B, and a bottom 312C, that at least partially define the chamber interior 314, which may be considered a plenum volume. As stated herein, it may be desirable in some embodiments to actively control the temperature of the processing chamber walls 312A, top 312B, and bottom 312C in order to prevent unwanted condensation on their surfaces. Some emerging semiconductor processing operations flow vapors, such as water and/or alcohol vapor, onto the substrate which adsorb onto the substrate, but they may also undesirably adsorb onto the chamber's interior surfaces. This can lead to unwanted deposition and etching on the chamber interior surfaces which can damage the chamber surfaces and cause particulates to flake off onto the substrate thereby causing substrate defects. In order to reduce and prevent unwanted condensation on the chamber's interior surfaces, the temperature of chamber's walls, top, and bottom may be maintained at a temperature at which condensation of chemistries used in the processing operations does not occur.

This active temperature control of the chamber's surfaces may be achieved by using heaters to heat the chamber walls 312A, the top 312B, and the bottom 312C. As illustrated in FIG. 3, chamber heaters 316A are positioned on and configured to heat the chamber walls 312A, chamber heaters 316B are positioned on and configured to heat the top 312B, and chamber heaters 316C are positioned on and configured to heat the bottom 312C. The chamber heaters 316A-316C may be resistive heaters that are configured to generate heat when an electrical current is flowed through a resistive element. Chamber heaters 316A-316C may also be fluid conduits through which a heat transfer fluid may be flowed, such as a heating fluid which may include heated water. In some instances, the chamber heaters 316A-316C may be a combination of both heating fluid and resistive heaters. The chamber heaters 316A-316C are configured to generate heat in order to cause the interior surfaces of each of the chamber walls 312A, the top 312B, and the bottom 312C to the desired temperature, which may be about 80° C. to about 130° C., including about 90° C. of about 120° C., for instance. It has been discovered that under some conditions, water and alcohol vapors do not condense on surfaces kept at about 90° C. or higher.

The chamber walls 312A, top 312B, and bottom 312C, may also be comprised of various materials that can withstand the chemistries used in the processing techniques. These chamber materials may include, for example, an aluminum, anodized aluminum, aluminum with a polymer, such as a plastic, a metal or metal alloy with a yttria coating, and a metal or metal alloy with a zirconia coating. These materials are configured to withstand the chemistries used in the processing techniques, such as anhydrous HF, water vapor, methanol, isopropyl alcohol, chlorine, fluorine gases, nitrogen gas, hydrogen gas, helium gas, and the mixtures thereof.

The apparatus 300 may also be configured to perform processing operations at or near a vacuum, such as at a pressure of about 0.1 Torr to about 10 Torr. This may include a vacuum pump 384 configured to pump the chamber interior 314 to low pressures, such as a vacuum having a pressure of about 0.1 Torr to about 30 Torr.

Various features of the pedestal 304 will now be discussed. The pedestal 304 includes a heater 322 (encompassed by the dashed rectangle in FIG. 3) that has a plurality of LEDs 324 that are configured to emit visible light having wavelengths including and between 400 nm to 800 nm, including 450 nm. The heater LEDs emit this visible light onto the backside of the substrate which heats the substrate. Visible light having wavelengths from about 400 nm to 800 nm is able to quickly and efficiently heat silicon wafers from ambient temperature, e.g., about 20° C., to about 600° C. because silicon absorbs light within this range. In contrast, radiant, including infrared radiant, heating may ineffectively heat silicon at temperatures up to about 400° C. because silicon tends to be transparent to infrared at temperatures lower than about 300° C. Additionally, radiant heaters that directly heat the topside of a wafer, as in many conventional semiconductor processes, can cause damage or other adverse effects to the topside films. Traditional "hot plate" heaters that rely on solid-to-solid thermal transference between the substrate and a heating platen, such as a pedestal with a heating coil, have relatively slow to heating and cooling rates, and provide non-uniform heating which may be caused by substrate warping and inconsistent contact with the heating platen. For example, it may take multiple minutes to heat a traditional pedestal to a desired temperature, and from a first to a second higher temperature, as well as to cool the pedestal to a lower temperature.

The heater's plurality of LEDs may be arranged, electrically connected, and electrically controlled in various manners. Each LED may be configured to emit a visible blue light and/or a visible white light. In certain embodiments, white light (produced using a range of wavelengths in the visible portion of the EM spectrum) is used. In some semiconductor processing operations, white light can reduce or prevent unwanted thin film interreference. For instance, some substrates have backside films that reflect different light wavelengths in various amounts, thereby creating an uneven and potentially inefficient heating. Using white light can reduce this unwanted reflection variation by averaging out the thin film interreference over the broad visible spectrum provided by white light. In some instances, depending on the material on the back face of the substrate, it may be advantageous to use a visible non-white light, such as a blue light having a 450 nm wavelength, for example, in order to provide a single or narrow band of wavelength which may provide more efficient, powerful, and direct heating of some substrates that may absorb the narrow band wavelength better than white light.

Various types of LED may be employed. Examples include a chip on board (COB) LED or a surface mounted diode (SMD) LED. For SMD LEDs, the LED chip may be fused to a printed circuit board (PCB) that may have multiple electrical contacts allowing for the control of each diode on the chip. For example, a single SMD chip is typically limited to having three diodes (e.g., red, blue, or green) that can be individually controllable to create different colors, for instance. SMD LED chips may range in size, such as 2.8×2.5 mm, 3.0×3.0 mm, 3.5×2.8 mm, 5.0×5.0 mm, and 5.6×3.0 mm. For COB LEDs, each chip can have more than three diodes, such as nine, 12, tens, hundreds or more, printed on the same PCB. COB LED chips typically have one circuit and two contacts regardless of the number of diodes, thereby providing a simple design and efficient single color application. The ability and performance of LEDs to heat the substrate may be measured by the watts of heat emitted by each LED; these watts of heat may directly contribute to heating the substrate.

Figure 4:
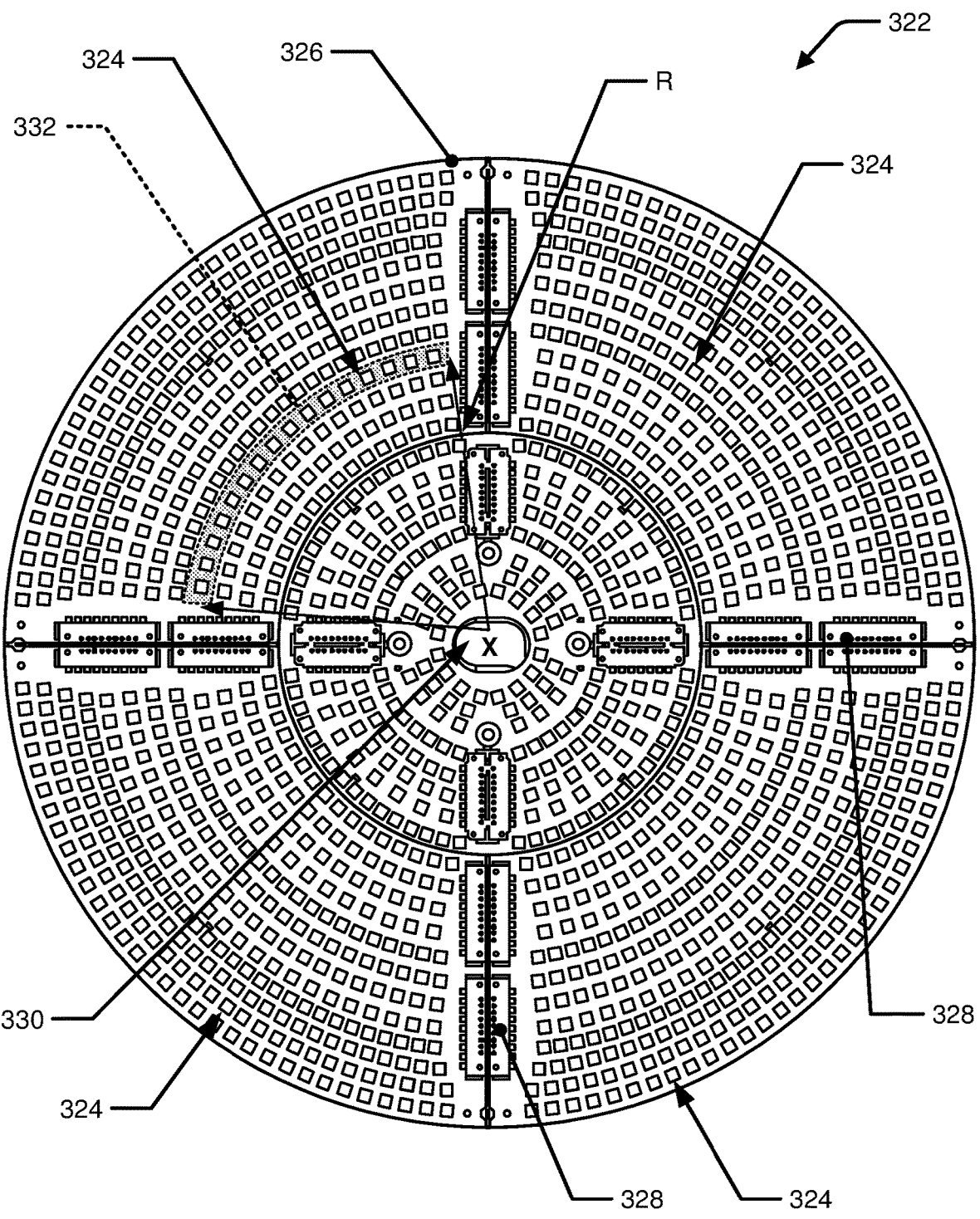
FIG. 4 depicts a top view of a substrate heater with a plurality LEDs.

FIG. 4 depicts a top view of a substrate heater with a plurality LEDs. This substrate heater 322 includes a printed circuit board 326 and the plurality of LEDs 324, some of which are labeled; this depicted plurality includes approximately 1,300 LEDs. External connections 328 are connected by traces to provide power to the plurality of LEDs 324. As illustrated in FIG. 4, the LEDs may be arranged along numerous arcs that are radially offset from the center 330 of the substrate heater 322 by different radiuses; in each arc, the LEDs may be equally spaced from each other. For example, one arc 332 is surrounded by a partially shaded dotted shape, includes 16 LEDs 324, and is a part of a circle with a radius R that extends around the center 330. The 16 LEDs 324 may be considered equally spaced from each other along this arc 332.

Figure 5:
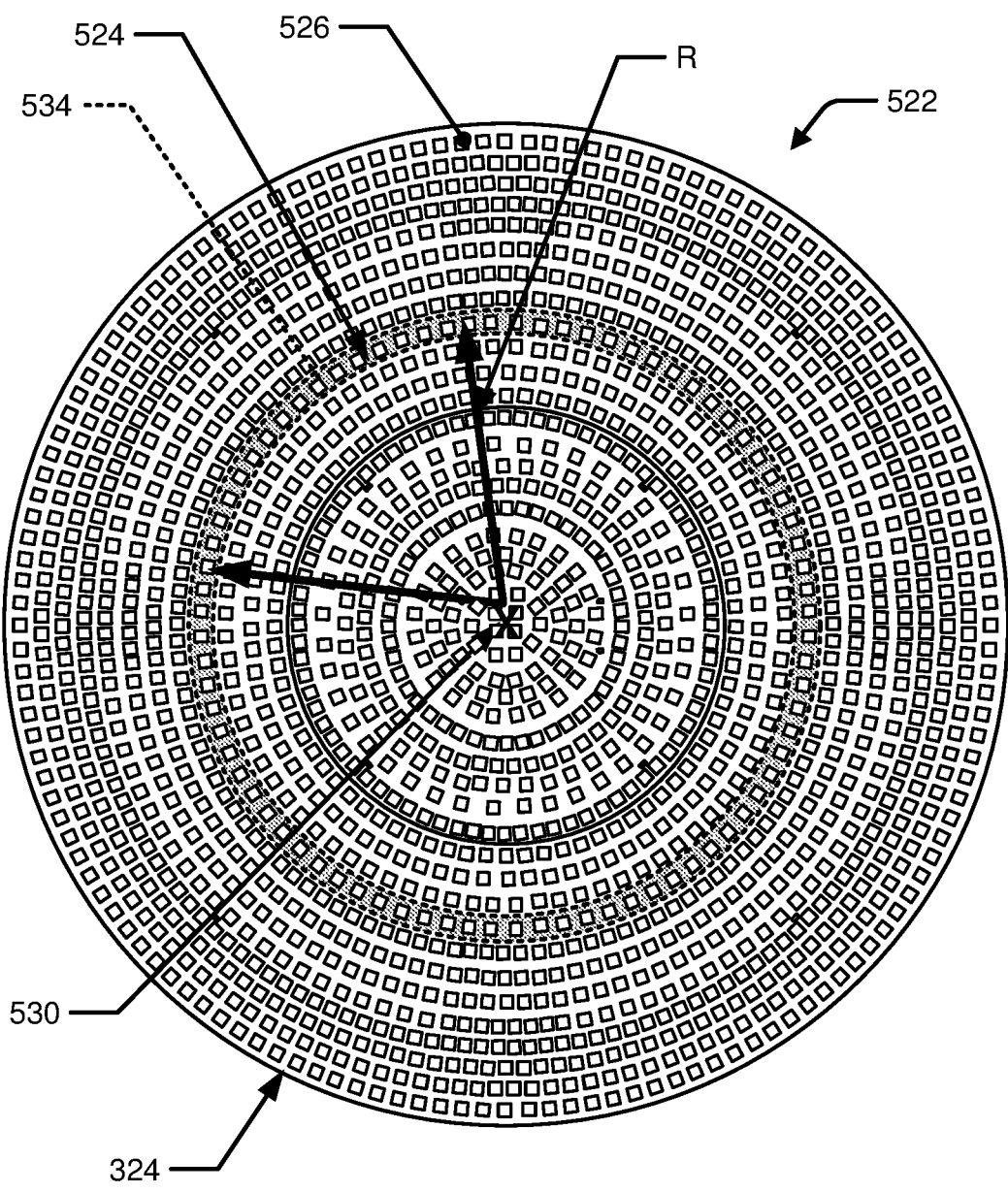
FIG. 5 depicts a top view of another substrate heater with a plurality LEDs.

In some embodiments, the LEDs may also be arranged along circles around the center of the substrate heater. In some instances, some LEDs may be arranged along circles while others may be arranged along arcs. FIG. 5 depicts a top view of another example of a substrate heater with a plurality LEDs. This substrate heater 522 includes a printed circuit board 526 and the plurality of LEDs 524, some of which are labeled. Here, LEDs 524 are arranged along numerous circles that are radially offset from the center 530 of the substrate heater 522 by different radiuses; in each circle, the LEDs may be equally spaced from each other. For example, one circle 534 is surrounded by a partially shaded ring, includes 78 LEDs 524, a radius R that extends around the center 530. The 78 LEDs 524 may be considered equally spaced from each other along this circle 534. The arrangement of the LEDs in FIG. 5 may provide a more uniform light and heat distribution pattern across the entire backside of the substrate because the regions of the substrate heater 322 in FIG. 4 that contain the external connections may provide unheated cold spots on the wafer, especially because the substrate and heater remain stationary with respect to each other during processing; the substrate and the substrate heater do not rotate.

In some embodiments, the plurality of LEDs may include at least about 1,000 LEDs, including about 1,200, 1,500, 2,000, 3,000, 4,000, 5,000, or more than 6,000, for instance. Each LED may, in some instances, be configured to uses 4 watts or less at 100% power, including 3 watts at 100% power and 1 watt at 100% power. These LEDs may be arranged and electrically connected into individually controllable zones to enable temperature adjustment and fine tuning across the substrate. In some instances, the LEDs may be grouped into at least 20, for instance, independently controllable zones, including at least about 25, 50, 75, 80, 85 90, 95, or 100 zones, for instance. These zones may allow for temperature adjustments in the radial and azimuthal (i.e., angular) directions. These zones can be arranged in a defined pattern, such as a rectangular grid, a hexagonal grid, or other suitable pattern for generating a temperature profile as desired. The zones may also have varying shapes, such as square, trapezoidal, rectangular, triangular, obround, elliptical, circular, annular (e.g., a ring), partially annular (i.e., an annular sector), an arc, a segment, and a sector that may be centered on the center of the heater and have a radius less than or equal to the overall radius of the substrate heater's PCB. For example, in FIG. 4 the LEDs have 88 zones that are organized into at least 20, such as 20 or 21, concentric rings. These zones are able to adjust the temperature at numerous locations across the wafer in order to create a more even temperature distribution as well as desired temperature profiles, such as higher temperatures around the edge of the substrate than in the center of the substrate. The independent control of these zones may also include the ability to control the power output of each zone. For example, each zone may have at least 15, 20, or 25 adjustable power outputs. In some instances, each zone may have one LED thereby enabling each LED to be individually controlled and adjusted which can lead to a more uniform heating profile on the substrate. Accordingly, in some embodiments, each LED of the plurality of LEDs in the substrate heater may be individually controllable.

In certain embodiments, the substrate heater 322 is configured to heat the substrate to multiple temperatures and maintain each such temperatures for various durations. These durations may include the following non-limiting examples of at least about 1 second, at least about 5 seconds, at least about 10 seconds, at least about 30 seconds, at least about 60 seconds, at least about 90 seconds, at least about 120 second, at least about 150 seconds, or at least about 180 seconds. The substrate heater may be configured to heat the substrate to about 50° C. to about 600° C., including about 50° C. to 150° C., including about 130° C., or about 150° C. to about 350° C., for example. Other possible temperature ranges are discussed above. The substrate heater may be configured to maintain the substrate at a temperature within these ranges for various durations, including the following non-limiting examples: at least about 1 second, at least about 5 seconds, at least about 10 seconds, at least about 30 seconds, at least about 60 seconds, at least about 90 seconds, at least about 120 seconds, at least about 150 seconds, or at least about 180 seconds, for example. Additionally, in some embodiments, the substrate heater 322 is configured to heat the substrate to any temperature within these ranges in less than about 60 seconds, less than about 45 seconds, less than about 30 seconds, or less than about 15 seconds, for instance. In certain embodiments, the substrate heater 322 is configured to heat a substrate at one or more heating rates, such as at least about 0.1° C./second to at least about 20° C./second, for example.

The substrate heater may increase the temperature of the substrate by causing the LEDs to emit the visible light at one or more power levels, including at least about 80%, at least about 90%, at least about 95%, or at least about 100% power. In some embodiments, the substrate heater is configured to emit about 10 W to about 4000 W, including at least about 10 W, at least about 30 W, at least about 0.3 kilowatt (kW), at least about 0.5 kW, at least about 2 kW, at least about 3 kW, or at least about 4 kw. The apparatus is configured to supply about 0.1 kW to about 9 kW of power to the pedestal; the power supply is connected to the substrate heater through the pedestal but is not depicted in the Figures. During temperature ramps, the substrate heater may operate at the high powers, and may operate at the lower power levels (e.g., about 5 W to about 0.5 kW) to maintain the temperature of a heated substrate.

The pedestal may include reflective material on its internal surfaces that, during operation, reflects and directs the light emitted by the LEDs onto the backside of the substrate supported by the pedestal. In some such embodiments, the substrate heater may include such reflective material positioned on a top surface 340, as shown in FIG. 3, of the PCB 326 on which the plurality of LEDs 324 is positioned. The reflective material may be comprised of aluminum, such as polished aluminum, stainless steel, aluminum alloys, nickel alloys, and other protective layers which can prevent oxidation of the metal and/or enhance the reflectivity at specific wavelengths, such as reaching greater than 99% reflectivity for specific wavelengths, and other durable reflective coatings. Additionally or alternatively, the pedestal 304 may have a bowl 346 in which the substrate heater 322 is at least partially positioned. The bowl 346 may have exposed internal surfaces 348 of the pedestal sidewalls 349 upon which the reflective material may be positioned. This reflective material increases the heating efficiency of the substrate heater and reduces the unwanted heating of the PCB 326 and pedestal 304 by advantageously directing light back onto the substrate that would have otherwise been absorbed by the PCB 326 and the pedestal 304.

In some embodiments, the substrate heater may also include a pedestal cooler that is thermally connected to the LEDs such that heat generated by the plurality of LEDs can be transferred from the LEDs to the pedestal cooler. This thermal connection is such that heat can be conducted from the plurality of LEDs to the pedestal cooler along one or more heat flow pathways between these components. In some instances, the pedestal cooler is in direct contact with one or more elements of the substrate heater, while in other instances other conductive elements, such as thermally conductive plates (e.g., that comprise a metal) are interposed between the substrate heater and the pedestal cooler. Referring back to FIG. 3, the substrate heater includes a pedestal cooler 336 in direct contact with the bottom of the PCB 326. Heat is configured to flow from the LEDs, to the PCB 326, and to the pedestal cooler 336. The pedestal cooler 336 also includes a plurality of fluid conduits 338 through which a heat transfer fluid, such as water, is configured to flow in order to receive the heat and thus cool the LEDs in the substrate heater 322. The fluid conduits 338 may be connected to a reservoir and pump, not pictured, located outside the chamber. In some instances, the pedestal cooler may be configured to flow water that is cooled, such as about 5° C. to about 20° C.

As provided herein, it may be advantageous to actively heat the exterior surfaces of the processing chamber 302. In some instances, it may similarly be advantageous to heat the exterior surfaces of the pedestal 304 in order to prevent unwanted condensation and deposition on its external surfaces. As illustrated in FIG. 3, the pedestal 304 may further include a pedestal heater 344 inside of the pedestal 304 that is configured to heat the exterior surfaces of the pedestal 304, including its sides 342A and bottom 342B. The pedestal heater 344 may include one or more heating elements, such as one or more resistive heating elements and fluid conduits in which a heating fluid is configured to flow. In some instances, the pedestal cooler and the pedestal heater may both have fluid conduits that are fluidically connected to each other such that the same heat transfer fluid may flow in both the pedestal cooler and the pedestal heater. In these embodiments, the fluid may be heated to about 50° C. to about 130° C. including about 90° C. to about 120° C.

The pedestal may also include a window to protect the substrate heater, including the plurality of LEDs, from damage caused by exposure to the processing chemistries and pressures used during processing operations. As illustrated in FIG. 3, the window 350 may be positioned above the substrate heater 322 and may be sealed to the sidewall 349 of the pedestal 304 in order to create a plenum volume within the pedestal that is fluidically isolated from the chamber interior. This plenum volume may also be considered the inside of the bowl 346. The window may be comprised of one or more materials that are optically transparent to the visible light emitted by LEDs, including light having wavelengths in the range of 400 nm to 800 nm. In some embodiments, this material may be quartz, sapphire, quartz with a sapphire coating, or calcium fluoride (CaF). The window may also not have any holes or openings within it. In some embodiments, the heater may have a thickness of 15 to 30 mm, including 20 mm and 25 mm.

Figure 6A:
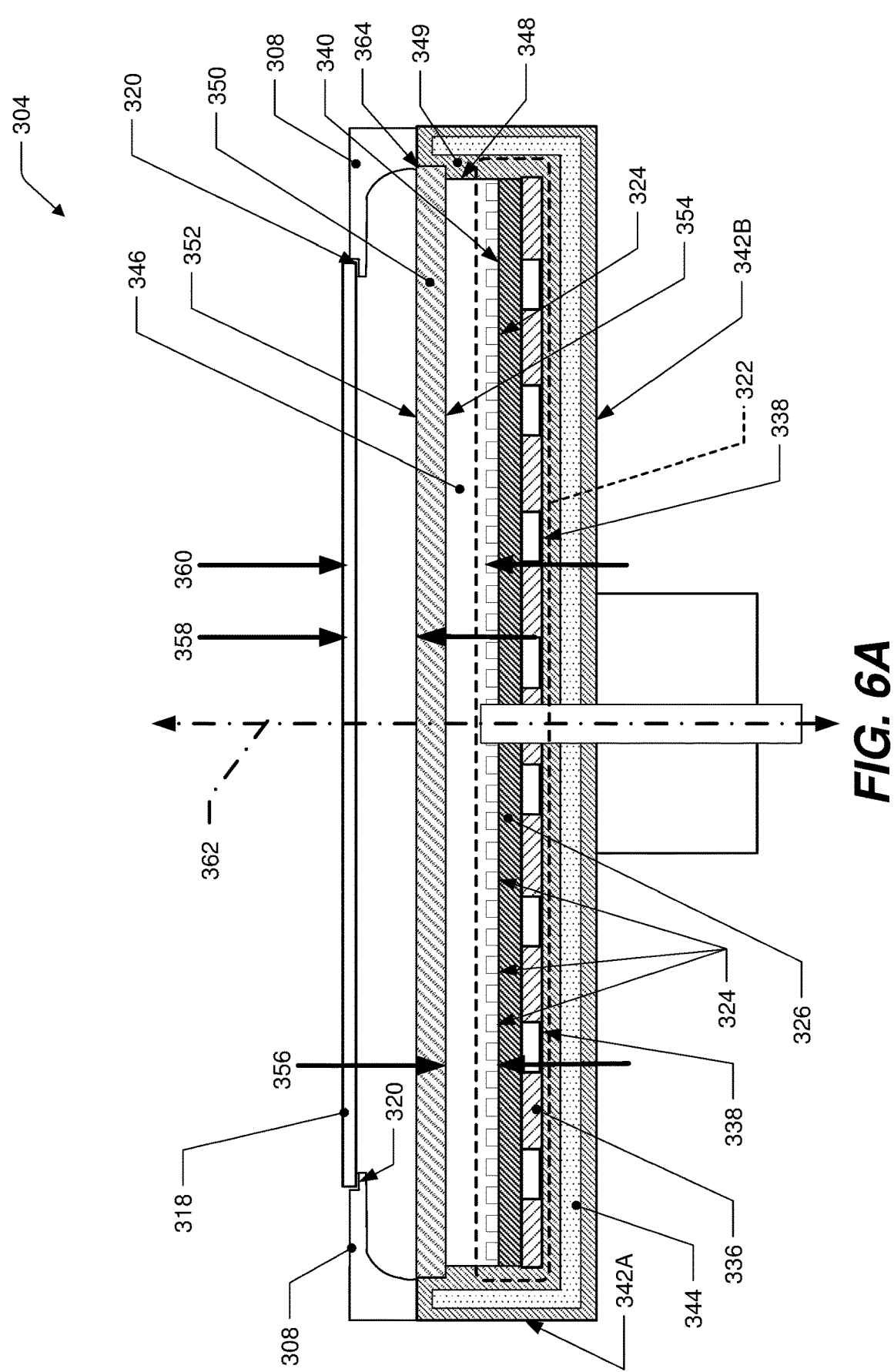
FIG. 6A depicts the pedestal of FIG. 5 with additional features in accordance with various embodiments.

FIG. 6A depicts the pedestal of FIG. 3 with additional features in accordance with various embodiments. As identified in FIG. 6A, the window 350 includes a top surface 352 that faces the substrate 318 supported by the pedestal 304, and a bottom surface 354 that faces the substrate heater 322. In some embodiments, the top and the bottom surfaces 352 and 354 may be flat, planar surfaces (or substantially flat, e.g., within ±10% or 5% of flat). In some other instances, the top 352, bottom 354, or both top 352 and bottom 354 may be nonplanar surfaces. The nonplanarity of these surfaces may be configured to refract and/or direct the light emitted by the substrate heater's 122 LEDs 324 to more efficiently and/or effectively heat the wafer. The nonplanarity may also be along some or all of the surface. For example, the entire bottom surface may have a convex or concave curvature, while in another example an outer annular region of the bottom surface may have a convex or concave curvature while the remaining portion of the surface is planar. In further examples, these surfaces may have multiple, but different, nonplanar sections, such as having a conical section in the center of the surface that is adjacent to a planar annular section, that is adjacent to a conical frustum surface at the same or different angle as the conical section. In some embodiments, the window 350 may have features that act as an array of lenses which are oriented to focus the light emitted by one or more LEDs, such as each LED.

With the window 350 positioned above the substrate heater 322, the window 350 gets heated by the substrate heater 322 which can affect the thermal environment around the substrate. Depending on the material or materials used for the window 350, such as quartz, the window may retain heat and progressively retain more heat over the course of processing one or more substrates. This heat can get radiatively transferred to the substrate and therefore directly heat the substrate. In some instances, the window can cause a temperature increase of about 50° C. to about 80° C. above the heater temperature. This heat may also create a temperature gradient through the thickness, or in the vertical direction, of the window. In some instances, the top surface 352 is 30° C. hotter than the bottom surface 354. It may therefore be advantageous to adjust and configure the chamber to account for and reduce the thermal effects of the window. As described in more detail below, this may include detecting the substrate's temperature and adjusting the substrate heater to account for the heat retained by the window.

Figure 6B:
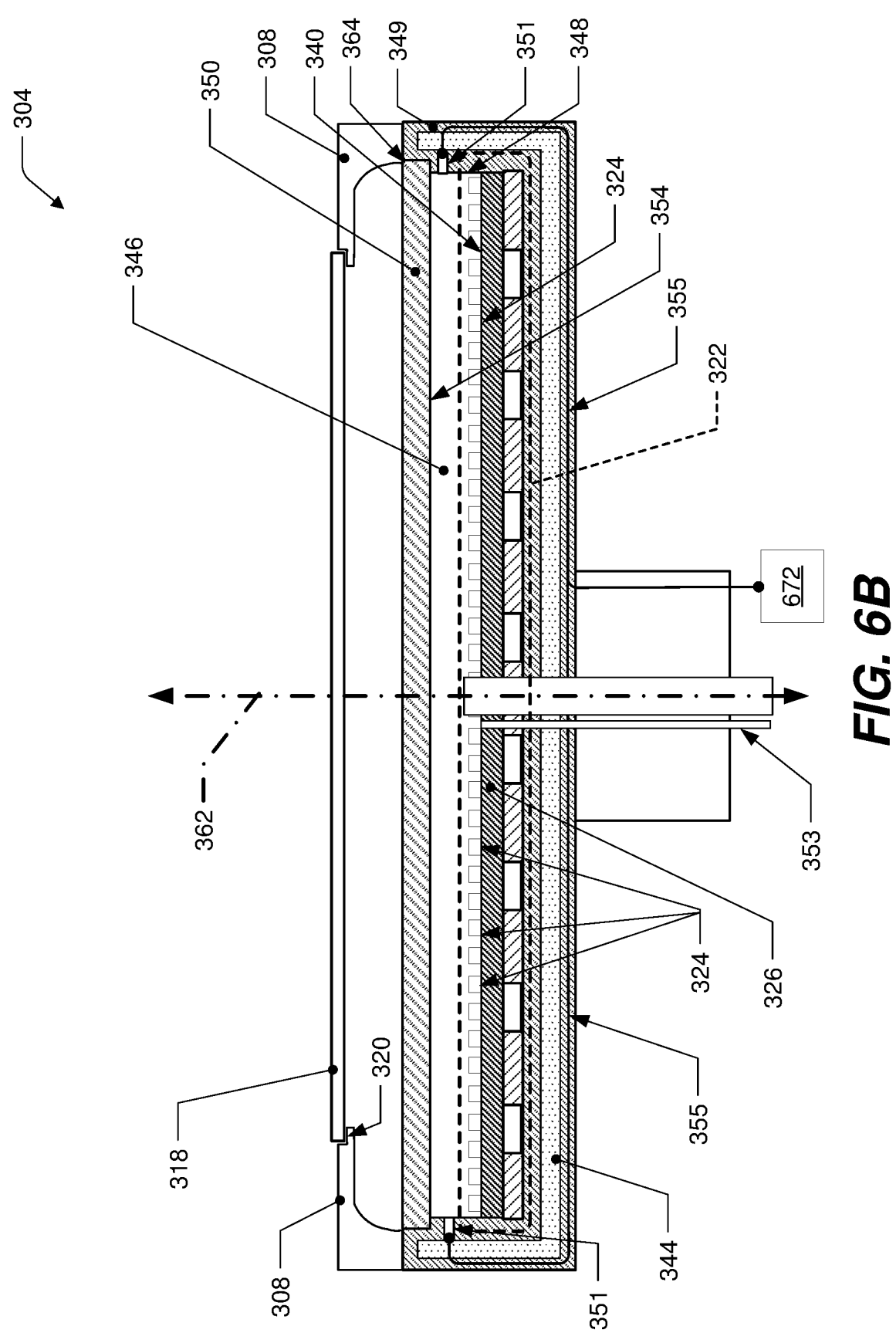
FIG. 6B depicts the pedestal of FIG. 6A with additional features in accordance with various embodiments.

This may also include various configurations of the pedestal, such as actively cooling the window. In some embodiments, like that shown in FIGS. 3 and 6A, the window 350 may be offset from the substrate heater 322 by a first distance 356. In some embodiments, this first distance may be about 2 mm to about 50 mm, including about 5 mm to about 40 mm. A cooling fluid, such as an inert gas, may be flowed between the window 350 and the substrate heater 322 in order to cool both the window 350 and the substrate heater 322. The pedestal may have one or more inlets and one or more outlets for flowing this gas within the plenum volume, or bowl 346, of the pedestal 304. The one or more inlets are fluidically connected to the inert gas source outside the chamber 302, which may include through fluid conduits that may be at least partially routed inside the pedestal 304. The one or more outlets are fluidically connected to an exhaust or other environment outside the chamber 302, which may also be through fluid conduits running within the pedestal. In FIG. 6B, which depicts the pedestal of FIG. 6A with additional features in accordance with various embodiments, one or more inlets 351 are positioned in the sidewalls 349 and extend through the surface 348; the one or more inlets are also fluidically connected to an inert gas source 672 through, in part, fluid conduits 355 that are routed through the pedestal 304. A single outlet 353 is positioned in a center region, i.e., not in the exact center but in close proximity, of the substrate heater 322. In some embodiments, the one or more gas inlets and one or more outlets may be switched, such that the one or more outlets extend through the sidewalls 349 (i.e., they are items 351 in FIG. 6B), and the one or more inlets may be the center region of the substrate heater 322 (i.e., they are item 353 in FIG. 6B). In some embodiments, there may be more than one outlet; in some embodiments, there may only be a single gas inlet. In some embodiments, one or more gas inlets extend through the interior surface 348 of the pedestal sidewall 349 underneath the LED heater 322 and one or more gas outlets extend through another part of the pedestal sidewall 349, such as a mounting bracket between the LED heater 322 and the pedestal sidewall 349.

In some embodiments, the window may be placed in direct, thermal contact with the substrate heater and the pedestal cooler may be configured to cool both the PCB and the window. In some embodiments, as also shown in FIGS. 3 and 6A, the window 350 may be thermally connected to the sidewalls 349 of the pedestal 304 in order to transfer some of the retained heat in the window 350 to the pedestal 304. This transferred heat may be further transferred out of the pedestal using, for instance, the pedestal heater 344 which may flow fluid through the pedestal 304 that is heated to about 20° C. to about 100° C., for instance. This heated fluid may be cooler than the temperature of the pedestal 304 at the thermal connection with the window 350. In some embodiments, the window 350 may have one or more fluid conduits within the window 350 through which transparent cooling fluid may be configured to flow. These conduits may be of various arrangements in order to provide even cooling and temperature distribution within the window, such as a single flowpath with a single inlet, a single outlet, and a serpentine section. The fluid may be routed to the window through the pedestal from a fluid source or reservoir outside the chamber.

As shown in FIGS. 3 and 6A, the pedestal's 304 substrate supports 308 are configured to support the substrate 318 above and offset from the window 350 and the substrate heater 322. In certain embodiments, the temperature of the substrate can be rapidly and precisely controlled by thermally floating, or thermally isolating, the substrate within the chamber. The heating and cooling of a substrate is directed at both the substrate's thermal mass and the thermal masses of other items in contact with the substrate. For instance, if the substrate is in thermal contact with a large body, such as the entirety of the substrate's back side resting on a large surface of a pedestal or electrostatic chuck as in many conventional etching apparatuses, this body acts as a heat sink for the substrate which affects the ability to accurately control the substrate temperature and reduces the quickness of substrate heating and cooling. It is therefore desirable to position the substrate so that the smallest thermal mass is heated and cooled. This thermal floating is configured to position the substrate so that it has minimal thermal contact (which includes direct and radiation) with other bodies in the chamber.

The pedestal 304 is therefore configured, in some embodiments, to support the substrate 318 by thermally floating, or thermally isolating, the substrate within the chamber interior 314. The pedestal's 304 plurality of substrate supports 308 are configured to support the substrate 318 such that the thermal mass of the substrate 318 is reduced as much as possible to the thermal mass of just the substrate 318. Each substrate support 308 may have a substrate support surface 320 that provides minimal contact with the substrate 318. The number of substrate supports 308 may range from at least 3 to, for example, at least 6 or more. The surface area of the support surfaces 320 may also be the minimum area required to adequately support the substrate during processing operations (e.g., in order to support the weight of the substrate and prevent inelastic deformation of the substrate). In some embodiments, the surface area of one support surface 320 may be less than about 0.1%, less than about 0.075%, less than about 0.5%, less than about 0.025%, or less than about 0.01%, for instance.

The substrate supports are also configured to prevent the substrate from being in contact with other elements of the pedestal, including the pedestal's surfaces and features underneath the substrate. As seen in FIGS. 3 and 6A, the substrate supports 308 hold the substrate 318 above and offset from the next adjacent surface of the pedestal 304 below the substrate 318, which is the top surface 352 (identified in FIG. 6B) of the window 350. As can be seen in these Figures, a volume or gap exists underneath the substrate, except for the contact with the substrate supports. As illustrated in FIG. 6A, the substrate 318 is offset from the top surface 352 of the window 350 by a distance 358. This distance 358 may affect the thermal effects caused by the window 350 to the substrate 318. The larger the distance 358, the less the effects. It was found that a distance 358 of 2 mm or less resulted in a significant thermal coupling between the window and the substrate; it is therefore desirable to have a larger distance 358 than 2 mm, such as at least 5 mm or 10 mm, 15 mm, 20 mm, or 30 mm for example.

The substrate 318 is also offset from the substrate heater 322 (as measured in some instances from a top surface of the substrate heater 322 which may be the top surface of the LEDs 324) by a distance 360. This distance 360 affects numerous aspects of heating the substrate 318. In some instances, the LEDs 324 provide a nonuniform heating pattern, which increases as the distance 360 decreases; conversely, this nonuniform heating pattern is reduced by increasing the distance 360. In some instances as the distance 360 increases, the heating efficiency decreases across the substrate and decreases more in the edge region and causes nonuniform heating of the substrate. In some embodiments, a distance 360 of about 10 mm to about 90 mm, including about 15 mm to about 25 mm, provides a substantially uniform heating pattern and acceptable heating efficiency.

As stated, the substrate supports 308 are configured to support the substrate 318 above the window. In some embodiments, these substrate supports are stationary and fixed in position; they are not lift pins or a support ring. In some embodiments, at least a part of each substrate support 308 that includes the support surface 320 may be comprised of a material that is transparent at least to light emitted by LEDS 324. This material may be, in some instances, quartz or sapphire. The transparency of these substrate supports 308 may enable the visible light emitted by the substrate heater's 122 LEDs to pass through the substrate support 308 and to the substrate 318 so that the substrate support 308 does not block this light and the substrate 318 can be heated in the areas where it is supported. This may provide a more uniform heating of the substrate 318 than with a substrate support comprising a material opaque to visible light. In some other embodiments, the substrate supports 308 may be comprised of a non-transparent material, such as zirconium dioxide ($ZrO_2$).

In some embodiments, such as those shown in FIG. 6A, the substrate supports 308 may be positioned closer to a center axis 362 of the window than the outer diameter 364 of the window 350. In some instances, portions of these substrate supports may extend over and above the window 350 such that they overlap the window 350 such that the support surfaces 320 are above the window 350.

Figures 7, 8:
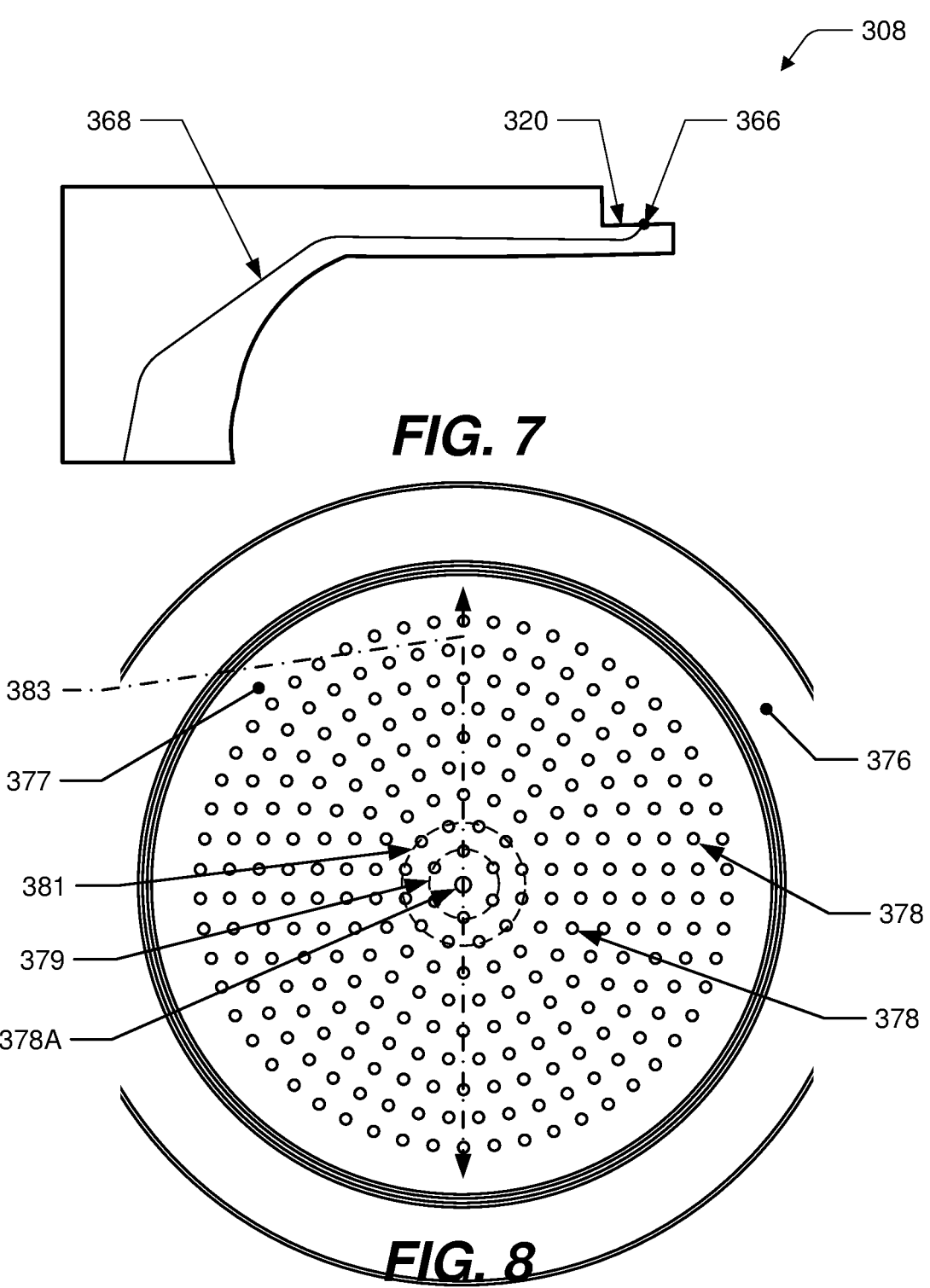
FIG. 7 depicts a substrate support of FIGS. 3 and 6A in accordance with disclosed embodiments.
FIG. 8 depicts a plan view of first example faceplate.

In some embodiments, the substrate supports may each contain a temperature sensor that is configured to detect the temperature of the substrate positioned on the support surface of the substrate supports. FIG. 7 depicts a substrate support of FIGS. 3 and 6A in accordance with disclosed embodiments. Here, the support surface 320 of the substrate support 308 is identified, along with a temperature sensor 366. In some embodiments, this temperature sensor 366 extends through the support surface 320 such that the temperature sensor 366 is in direct contact with a substrate held by the support surface 320. In some other embodiments, the temperature sensor 366 is positioned within the substrate support 308 and below the support surface 320. In some embodiments, this temperature sensor 366 is a thermocouple. In some other embodiments, the temperature sensor 366 may be a thermistor, a resistance temperature detector (RTD), and semiconductor sensor. The electrical wiring 368 for the temperature sensor 366 may be routed through the substrate support 308 and may also be routed through the pedestal 304.

Referring back to FIG. 3, in some embodiments, the pedestal is also configured to move vertically. This may include moving the pedestal such that a gap 386 between a faceplate 376 of the gas distribution unit 310 and the substrate 318 is capable of being in a range of 2 mm and 70 mm. As provided in more detail below, moving the pedestal vertically may enable active cooling of the substrate as well as rapid cycling time of processing operations, including flowing gas and purging, due to a low volume created between the gas distribution unit 310 and the substrate 318. This movement may also enable the creation of a small process volume between the substrate and the gas distribution unit which can result in a smaller purge and process volume and thus reduce purge and gas movement times and increase throughput.

The gas distribution unit 310 is configured to flow process gases, which may include liquids and/or gases, such as a reactant, modifying molecules, converting molecules, or removal molecules, onto the substrate 318 in the chamber interior 314. As seen in FIG. 3, the gas distribution unit 310 includes one or more fluid inlets 370 that are fluidically connected to one or more gas sources 372 and/or one or more vapor sources 374. In some embodiments, the gas lines and mixing chamber may be heated to prevent unwanted condensation of the vapors and gases flowing within. These lines may be heated to at least about 80° C., 90° C., or 120° C. The one or more vapor sources may include one or more sources of gas and/or liquid which is vaporized. The vaporizing may be a direct inject vaporizer, a flow over vaporizer, or both. The gas distribution unit 310 also includes the faceplate 376 that includes a plurality of through-holes 378 that fluidically connect the gas distribution unit 310 with the chamber interior 314. These through-holes 378 are fluidically connected to the one or more fluid inlets 370 and also extend through a front surface 377 of the faceplate 376, with the front surface 377 configured to face the substrate 318. In some embodiments, the gas distribution unit 310 may be considered a top plate and in some other embodiments, it may be considered a showerhead.

The through-holes 378 may be configured in various ways in order to deliver uniform gas flow onto the substrate. In some embodiments, these through-holes may all have the same outer diameter, such as about 0.03 inches to about 0.5 inches, including about 0.4 inches (1.016 mm). These faceplate through-holes may also be arranged throughout the faceplate in order to create uniform flow out of the faceplate.

FIG. 8 depicts a plan view of first example faceplate 376 with the front surface 377 (the surface configured to face a substrate) and the through-holes 378 visible. As can be seen, the faceplate 376 through-holes 378 extend through faceplate 376 and the front surface 377. These through-holes are also arranged along multiple circles that are centered around the center axis of the faceplate, thereby offsetting the holes from each other. For example, the faceplate 376 may have a through-hole 378A that is centered on the center axis of the faceplate 376. Immediately adjacent to this center through-hole 378A may be a plurality of holes arranged equally spaced along a first circle 379 with a first diameter; immediately radially outwards from this circle may be another circle 381 with a second plurality of holes having more holes than the plurality of holes, and this second plurality of holes may be equally spaced along this second circle. This equal spacing may not always be exact and may be considered substantially equally spaced, which may be due to manufacturing or other inconsistencies, such that the spacing may be within about +/−5% of equal. As illustrated, some circles of through-holes 378 may be centered on a referential datum 383, while other circles of the through-holes are offset from the referential datum 383 by an angle, such as about 15°, 7.5°, etc. Here, the through-holes along the first circle 379 two through-holes centered on the datum, while the through-holes along the second circle are not centered on the referential datum 383 and are offset from the datum 383 by about 15°. The concentric circles of through-holes may alternate between holes centered on the datum 383 and offset from the datum 383.

Figure 9:
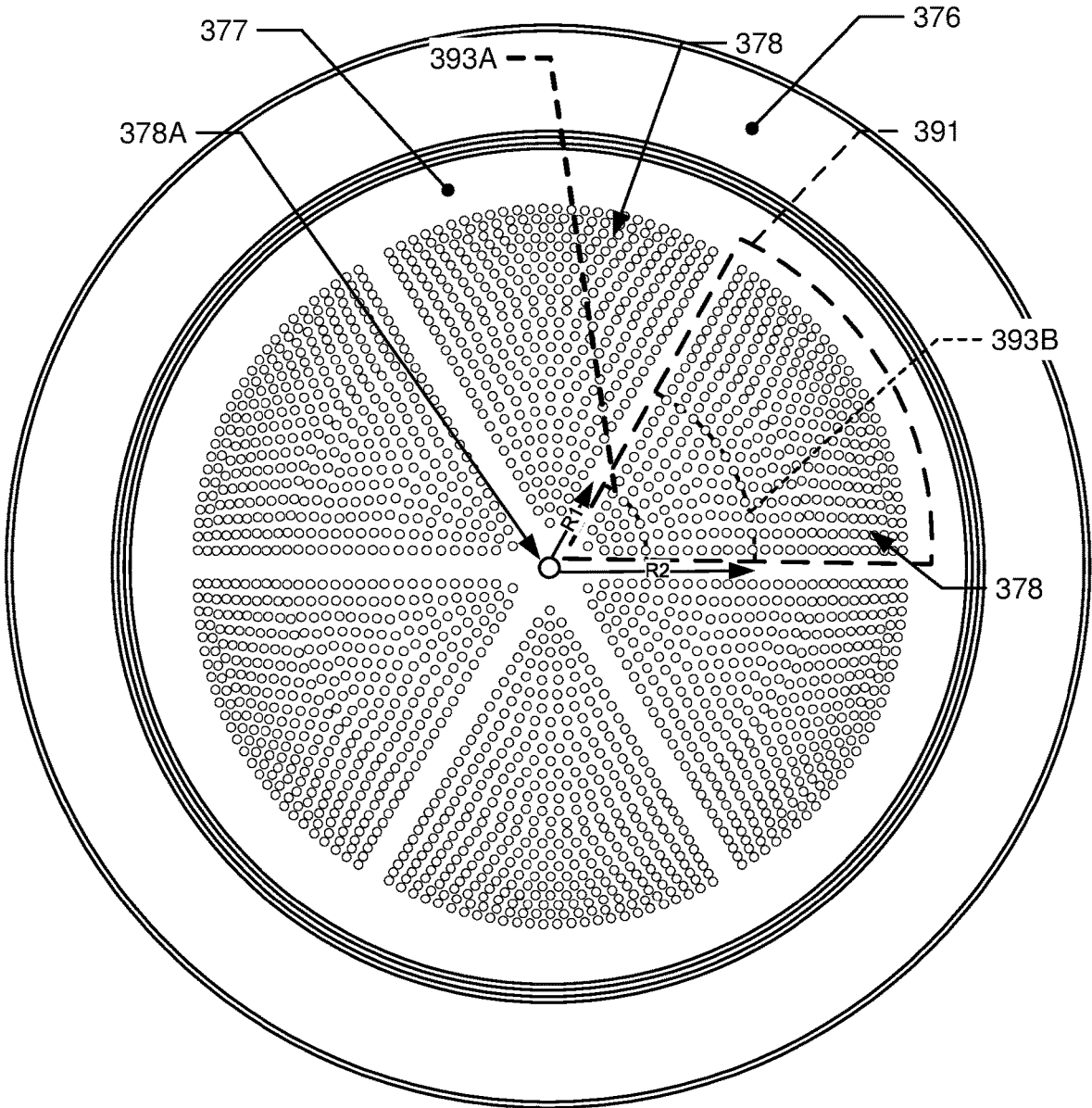
FIG. 9 depicts a plan view of second example faceplate.

FIG. 9 depicts a plan view of second example faceplate 376 with the front surface 377 (the surface configured to face a substrate) and the through-holes 378 visible. As can be seen, the faceplate 376 through-holes 378 extend through the faceplate 376 and the front surface 377. These through-holes are arranged different than in FIG. 8, with one through-hole 378 centered on the center axis of the faceplate 376, and the through-holes 378 arranged in 6 sectors, such that in each sector, the through-holes are equally spaced along arcs in the sector. For instance, one sector 391 is contained with a dashed shape and the holes are arranged along a plurality of arcs within the sector that increase as their radial distance from the center of the faceplate 376 increases. A first example arc 393A is identified along which 6 through-holes 378 are equally spaced, and a second example arc 393B is identified along which 12 through-holes are equally spaced. The second example arc 393B is larger than the first example arc 393A and has a greater radial distance R2 than the first arc's 393A radial distance R1.

Referring back to FIG. 3, the gas distribution unit 310 may also include a unit heater 380 that is thermally connected to the faceplate 376 such that heat can be transferred between the faceplate 376 and the unit heater 380. The unit heater 380 may include fluid conduits in which a heat transfer fluid may be flowed. Similar to above, the heat transfer fluid may be heated to a temperature range of about 20° C. and 120° C., for example. In some instances, the unit heater 380 may be used to heat the gas distribution unit 310 to prevent unwanted condensation of vapors and gases; in some such instances, this temperature may be at least about 90° C. or 120° C.

In some embodiments, the gas distribution unit 310 may include a second unit heater 382 that is configured to heat the faceplate 376. This second unit heater 382 may include one or more resistive heating elements, fluid conduits for flowing a heating fluid, or both. Using two heaters 380 and 382 in the gas distribution unit 310 may enable various heat transfers within the gas distribution unit 310. This may include using the first and/or second unit heaters 380 and 382 to heat the faceplate 376 in order to provide a temperature-controlled chamber, as described above, in order to reduce or prevent unwanted condensation on elements of the gas distribution unit 310.

The apparatus 300 may also be configured to cool the substrate. This cooling may include flowing a cooling gas onto the substrate, moving the substrate close to the faceplate to allow heat transfer between the substrate and the faceplate, or both. Actively cooling the substrate enables more precise temperature control and faster transitions between temperatures which reduces processing time and improves throughput. In some embodiments, the first unit heater 380 that flows the heat transfer fluid through fluid conduits may be used to cool the substrate 318 by transferring heat away from the faceplate 376 that is transferred from the substrate 319. A substrate 318 may therefore be cooled by positioning it in close proximity to the faceplate 376, such as by a gap 386 of less than or equal to 5 mm or 2 mm, such that the heat in the substrate 318 is radiatively transferred to the faceplate 376, and transferred away from the faceplate 376 by the heat transfer fluid in the first unit heater 380. The faceplate 376 may therefore be considered a heat sink for the substrate 318 in order to cool the substrate 318.

In some embodiments, the apparatus 300 may further include a cooling fluid source 373 which may contain a cooling fluid (a gas or a liquid), and a cooler (not pictured) configured to cool the cooling fluid to a desired temperature, such as less than or equal to at least about 90° C., at least about 70° C., at least about 50° C., at least about 20° C., at least about 10° C., at least about 0° C., at least about −50° C., at least about −100° C., at least about −150° C., at least about −190° C., at least about −200° C., or at least about −250° C., for instance. The apparatus 300 includes piping to deliver the cooling fluid to the one or more fluid inlets 370, and the gas distribution unit 310 which is configured to flow the cooling fluid onto the substrate. In some embodiments, the fluid may be in liquid state when it is flowed to the chamber 302 and may turn to a vapor state when it reaches the chamber interior 314, for example if the chamber interior 314 is at a low pressure state, such as described above, e.g., about 0.1 Torr to about 10 Torr, for instance. The cooling fluid may be an inert element, such as nitrogen, argon, or helium. In some instances, the cooling fluid may include, or may only have, a non-inert element or mixture, such as hydrogen gas. In some embodiments, the flow rate of the cooling fluid into the chamber interior 314 may be at least about 0.25 liters per minute, at least about 0.5 liters per minute, at least about 1 liters per minute, at least about 5 liters per minute, at least about 10 liters per minute, at least about 50 liters per minute, or at least about 100 liters per minute, for example. In certain embodiments, the apparatus may be configured to cool a substrate at one or more cooling rates, such as at least about 5° C./second, at least about 10° C./second, at least about 15° C./second, at least about 20° C./second, at least about 30° C./second, or at least about 40° C./second.

In some embodiments, the apparatus 300 may actively cool the substrate by both moving the substrate close to the faceplate and flowing cooling gas onto the substrate. In some instances, the active cooling may be more effective by flowing the cooling gas while the substrate is in close proximity to the faceplate. The effectiveness of the cooling gas may also be dependent on the type of gas used. The apparatuses provided herein can therefore rapidly heat and cool a substrate.

In some embodiments, the apparatus 300 may include a mixing plenum for blending and/or conditioning process gases for delivery before reaching the fluid inlets 370. One or more mixing plenum inlet valves may control introduction of process gases to the mixing plenum. In some other embodiments, the gas distribution unit 310 may include one or more mixing plenums within the gas distribution unit 310. The gas distribution unit 310 may also include one or more annular flow paths fluidically connected to the through-holes 378 which may equally distribute the received fluid to the through-holes 378 in order to provide uniform flow onto the substrate.

The apparatus 300 may also include one or more additional non-contact sensors for detecting the temperature of the substrate. One such sensor may be a new pyrometer that is capable of detecting numerous temperature ranges of a silicon substrate. It is desirable to detect the temperature of substrates having different treatments, e.g., whether the silicon is doped or not doped, at different temperatures ranges at which processing operations may occur, such as under about 200° C., greater than about 200° C. and less than about 600° C., or above 600° C. However, traditional pyrometers are not able to detect different substrates within these ranges. Traditional pyrometers measure the optical signals reflected or emitted by an object's surface to determine the object's temperature according to some calibration. However, many silicon wafers cannot be measured by these pyrometers because the silicon is optically transparent at various temperatures and with various treatments. For example, a traditional pyrometer is capable of detecting emissions in a range of about 8-15 microns, but most silicon substrates under at least about 200° C. do not have an consistent emission signal in the range of about 8-15 microns and are therefore undetectable by a traditional pyrometer when under about 200° C.

Lightly doped, or undoped, silicon substrates have an emission signal from approximately 0.95 to 1.1 microns when the substrates are at or below about 300° C., that doped silicon substrates have an emission signal of about 1 microns to about 4 microns when the substrates are below about 200° C., that silicon substrates have an emission signal at approximately 1 micron when around room temperature, such as under about 100° C. including, for instance 20° C., and that silicon substrates have an emission signal of about 8 to 15 microns when at temperatures over about 600° C. The new pyrometer is therefore configured to detect multiple emission ranges in order to detect multiple substrates, e.g., doped, low doped, or not doped, at various temperature ranges. This includes the configuration to detect emission ranges of about 0.95 microns to about 1.1 microns, about 1 micron, about 1 to about 4 microns, and/or about 8 to 15 microns. The new pyrometer is also configured to detect the temperature of a substrate at a shorter wavelength in order to differentiate the signal from the thermal noise of the chamber.

The new pyrometer may include an emitter configured to emit infrared signals and a detector configured to receive emissions. Referring to FIG. 3, the apparatus includes the new pyrometer 388 having an emitter within the pyrometer 388 and a detector 390. The new pyrometer may be configured to emit signals on one side of the substrate, either the top or the bottom, and configured to receive signals on the other side of the substrate. For instance, the emitter may emit signals on the top of the substrate and the detector is under the substrate and receives signals emitted through and under the substrate. The apparatus may therefore have at least a first port 392A on the top of the chamber 302, such as the port 392A through the center of the gas distribution unit 310, and a second port 392B through the pedestal 304 and substrate heater 322. The emitter in the pyrometer 388 may be connected to one of the ports 392A or 392B via a fiberoptic connection, such as the first port 392A as shown in FIG. 3, and the detector is optically connected to the other port, such as the second port 392B in FIG. 3. The first port 392A may include a port window 394 to seal the first port 392A from the chemistries within the chamber interior 314. The second port 392B is seen in FIG. 3 extending through the pedestal 304 and the substrate heater such that the emitter's emissions can pass through the substrate, through the window 350, into the second port 392B and to the detector 390 that may be positioned in the second port or optically connected to the second port through another fiberoptic connection (not shown). In some other embodiments, the emitter and the detector are flipped, such that the emitter emits through the second port 392B and the detector detects through the first port 392A.

The apparatus 300 may also include one or more optical sensors 398 to detect one or more metrics of the visible light emitted by the LEDs. In some embodiments, these optical sensors may be one or more photodetectors configured to detect the light intensity and/or thermal radiation of the visible light emitted by the LEDs of the substrate heater. In FIG. 3, a single optical sensor 398 is shown as connected to the chamber interior 314 via fiberoptic connection such that the optical sensor 398 is able to detect light emitted by the substrate heater 322. The optical sensor 398, and additional optical sensors, can be positioned in various locations in the top and sides, for instance, of the chamber 302 in order to detect the emitted light at various locations within the chamber 302. As discussed below, this may enable the measurement and adjustment of the substrate heater, such as the adjustment of one or more independently controllable zones of the LEDs. In some embodiments, there may be a plurality of optical sensors 398 arranged along a circle or multiple concentric circles in order to measure various regions of the LEDs throughout the chamber 302.

In some embodiments, the apparatus may further be configured to generate a plasma and use the plasma for some processing in various embodiments. This may include having a plasma source configured to generate a plasma within the chamber interior, such as a capacitively coupled plasma (CCP), an inductively coupled plasma (ICP), an upper remote plasma, and a lower remote plasma.

The apparatuses described herein are not limited to ALE etching operations. These apparatuses may be used with any etching technique.

EXPERIMENTAL

Experiment 1

Figure 10:
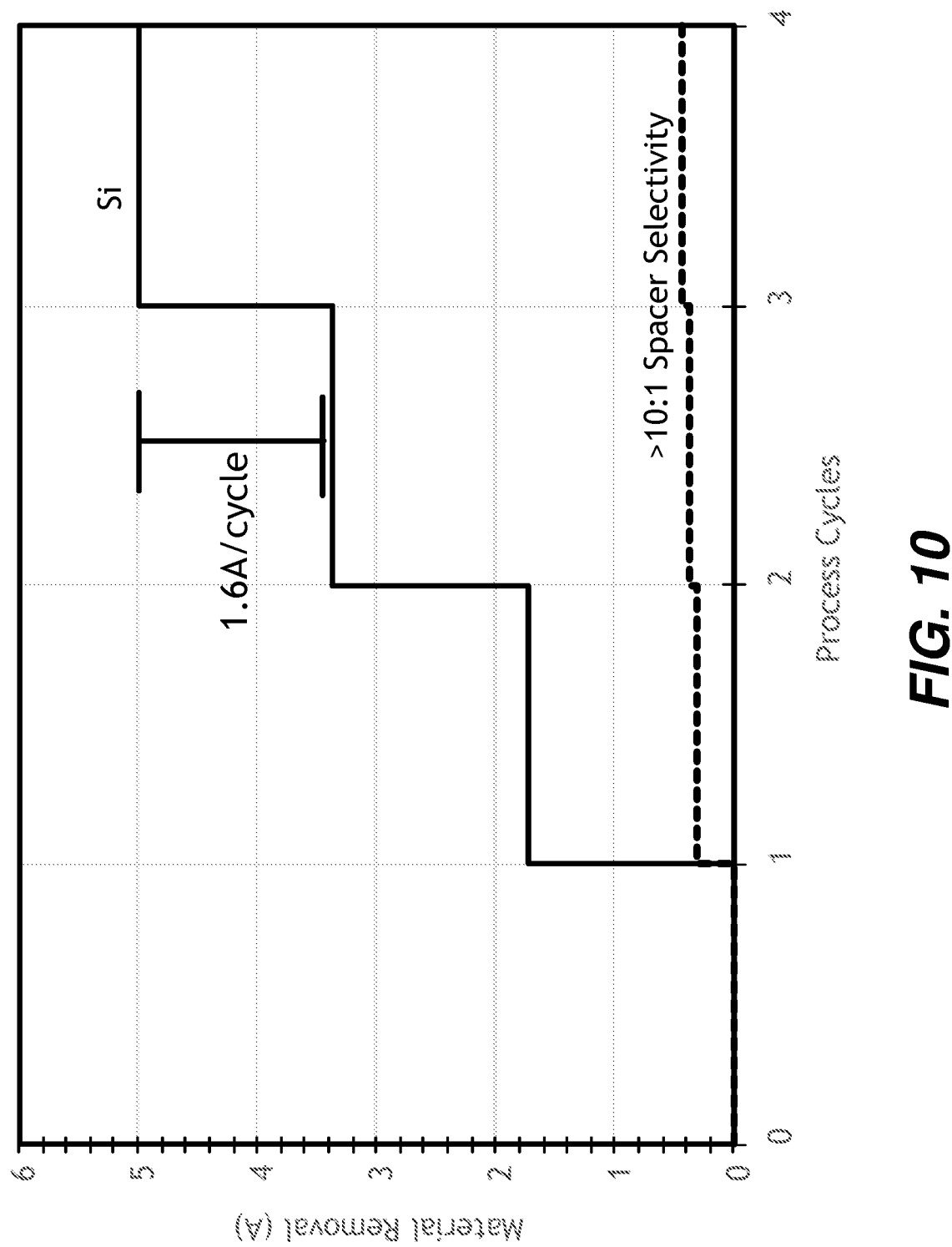
FIG. 10 depicts a graph showing amount of silicon and silicon oxycarbide removed per process cycle in an etching process performed using certain disclosed embodiments.

Blanket silicon and silicon oxycarbide material was removed using certain disclosed embodiments. Blanket silicon material was exposed to several cycles of removal, a cycle including oxygen exposure at 400° C. followed by HF and organic solvent exposure at 100° C. Removal was performed thermally without a plasma. The amount etched per cycle was 1.6 Å as shown in FIG. 10. These results suggest that silicon etching can be performed precisely and uniformly, and can be applicable to achieving uniform top-to-bot and feature-to-feature etching on features.

Silicon oxycarbide material was exposed to several cycles of removal, a cycle including oxygen exposure at 400° C. followed by HF and organic solvent exposure at 100° C. Removal was performed thermally without a plasma. The amount etched per cycle was less than 0.5 Å per cycle, as shown in FIG. 10. These results suggest that exposure of a surface having silicon and silicon oxycarbide material to these etching cycles will achieve an etching selectivity of silicon to silicon oxycarbide greater than about 10:1, which can be applicable to, but is not limited to the application of, removing silicon material in the presence of silicon oxycarbide spacers.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method for etching a substrate, the method comprising:

providing the substrate in a reaction chamber, the substrate comprising a silicon-containing material that is to be partially or wholly removed selectively relative to a material selected from the group consisting of nitrides, carbonitrides, and oxycarbides from the substrate during etching;

providing an oxidant in the reaction chamber and exposing the substrate to the oxidant to modify the silicon-containing material on the substrate to form a modified silicon-containing material; and providing a removal gas in the reaction chamber and exposing the substrate to the removal gas while providing thermal energy to the reaction chamber to drive a reaction that partially or wholly etches the silicon-containing material from the substrate by removing the modified silicon-containing material, wherein the substrate is not exposed to plasma during etching.

2. The method of claim 1, wherein the oxidant is selected from the group consisting of oxygen, hydrogen peroxide, nitrous oxide, nitric oxide, ozone, and combinations thereof.

3. The method of claim 1, wherein the providing the oxidant and providing the removal gas are performed in cycles.

4. The method of claim 1, further comprising:

prior to providing the oxidant, providing a gas mixture in the reaction chamber and exposing the substrate to thermal energy and to the gas mixture, wherein the thermal energy drives a second reaction between the gas mixture and the silicon-containing material to form a modified silicon-containing material, and wherein the second reaction etches the modified silicon-containing material to thereby partially or wholly etch the silicon-containing material.

5. The method of claim 1, wherein the removal gas comprises an organic solvent and/or water.

6. The method of claim 5, wherein the organic solvent and/or water is selected from the group consisting of alcohols, alkanes, aromatic solvents, ethers, nitriles, and heterocycles.

7. The method of claim 1, wherein the removal gas comprises a halogen source selected from the group consisting of HF, hydrogen chloride (HCl), hydrogen bromide (HBr), fluorine ($F_2$), chlorine ($Cl_2$), bromine ($Br_2$), chlorine trifluoride ($ClF_3$), nitrogen trifluoride ($NF_3$), nitrogen trichloride ($NCl_3$), and nitrogen tribromide ($NBr_3$).

8. The method of claim 1, wherein the etching is self-limiting.

9. The method of claim 1, wherein the thermal energy is provided at a temperature of about 350° C. to about 400° C. and wherein the oxidant comprises oxygen.

10. The method of claim 1, wherein the thermal energy is provided at a temperature of about 50° C. to about 150° C. and wherein the oxidant comprises ozone.

11. The method of claim 1, wherein the removal gas further comprises an additive.

12. The method of claim 11, wherein the additive is selected from the group consisting of amines, amino acids, oxidizers, bifluoride sources, aldehydes, carbenes, and organic acids.

13. The method of claim 11, wherein the removal gas comprises an organic solvent and/or water and the additive is from about 0.1-5% (by weight) of the total amount of the additive and the organic solvent and/or water.

14. The method of claim 11, wherein volumetric ratio of the halogen source to an additive is no more than 10.

* * * * *